United States Patent
Lee et al.

(10) Patent No.: US 8,975,683 B2
(45) Date of Patent: Mar. 10, 2015

(54) NONVOLATILE PIPE GATE MEMORY DEVICE

(75) Inventors: Ki-Hong Lee, Gyeonggi-do (KR); Kwon Hong, Gyeonggi-do (KR); Dae-Gyu Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 12/880,891

(22) Filed: Sep. 13, 2010

(65) Prior Publication Data

US 2011/0291177 A1 Dec. 1, 2011

(30) Foreign Application Priority Data

May 31, 2010 (KR) .................. 10-2010-0051427

(51) Int. Cl.
- *H01L 29/792* (2006.01)
- *H01L 29/788* (2006.01)
- *H01L 27/115* (2006.01)
- *H01L 21/28* (2006.01)
- *H01L 29/66* (2006.01)

(52) U.S. Cl.
CPC .... *H01L 27/11578* (2013.01); *H01L 21/28282* (2013.01); *H01L 27/11582* (2013.01); *H01L 29/66833* (2013.01); *H01L 29/7926* (2013.01)
USPC .................... 257/314; 257/E29.309; 257/324

(58) Field of Classification Search
CPC .................. H01L 27/11578; H01L 27/11582
USPC ................................. 257/314, 324, E29.309
See application file for complete search history.

(56) References Cited

U.S. PATENT DOCUMENTS

| | | |
|---|---|---|
| 2009/0059676 A1 | 3/2009 | Lai et al. |
| 2010/0062581 A1 | 3/2010 | Park et al. |
| 2010/0072538 A1* | 3/2010 | Kito et al. ....... 257/326 |
| 2010/0181612 A1* | 7/2010 | Kito et al. ....... 257/319 |
| 2010/0244119 A1* | 9/2010 | Fukuzumi et al. ....... 257/324 |
| 2011/0013454 A1* | 1/2011 | Hishida et al. ....... 365/185.11 |
| 2011/0019480 A1* | 1/2011 | Kito et al. ....... 365/185.18 |
| 2011/0049607 A1* | 3/2011 | Yahashi ....... 257/324 |
| 2011/0049608 A1* | 3/2011 | Kidoh et al. ....... 257/324 |
| 2011/0069552 A1* | 3/2011 | Itagaki et al. ....... 365/185.18 |
| 2011/0127597 A1* | 6/2011 | Fukuzumi et al. ....... 257/314 |
| 2011/0216604 A1* | 9/2011 | Mikajiri et al. ....... 365/185.26 |

FOREIGN PATENT DOCUMENTS

| | | |
|---|---|---|
| CN | 101308824 | 11/2008 |
| JP | 2007-317874 | 12/2007 |

(Continued)

OTHER PUBLICATIONS

Office Action issued by the United States Patent and Trademark Office for a continuation U.S. Appl. No. 13/403,065 on Mar. 26, 2014.

(Continued)

*Primary Examiner* — Jerome Jackson, Jr.
*Assistant Examiner* — Paul Budd
(74) *Attorney, Agent, or Firm* — IP & T Group LLP

(57) ABSTRACT

A nonvolatile memory device includes a pipe insulation layer having a pipe channel hole, a pipe gate disposed over the pipe insulation layer, a pair of cell strings each having a columnar cell channel, and a pipe channel coupling the columnar cell channels and surrounding inner sidewalls and a bottom of the pipe channel hole.

17 Claims, 39 Drawing Sheets

(56) References Cited

FOREIGN PATENT DOCUMENTS

| | | |
|---|---|---|
| KR | 1020100020435 | 2/2010 |
| KR | 1020100035105 | 4/2010 |
| KR | 1020100054100 | 5/2010 |
| WO | WO 2010/004706 | 1/2010 |

OTHER PUBLICATIONS

Notification of the First Office Action issued by the State Intellectual Property Office of People's Republic of China on Nov. 27, 2014.

* cited by examiner ered. Moreover, a method for fabricating the same is also provided.

NONVOLATILE PIPE GATE MEMORY DEVICE

CROSS-REFERENCE TO RELATED APPLICATIONS

The present application claims priority of Korean Patent Application No. 10-2010-0051427, filed on May 31, 2010, which is incorporated herein by reference in its entirety.

BACKGROUND OF THE INVENTION

Exemplary embodiments of the present invention relate to a nonvolatile memory device, and more particularly, to a nonvolatile memory device and a method for fabricating the same.

In a three-dimensional nonvolatile memory device, a U-shaped string structure is a structure in which a source selection gate and a drain selection gate are formed over a memory string. It is known that the U-shaped string structure is very advantageous in view of device characteristics, as compared with a vertical string structure in which selection gates are formed above and under a memory string. To operate the U-shaped memory string, a transistor for electrical coupling is required at the bottom. Such a transistor is called a pipe channel transistor.

Two strings coupled to a source and a drain are coupled by a pipe channel transistor. In addition, control gate electrodes of two strings must be separated from each other by an etching process.

FIG. 1 is a cross-sectional view of a conventional nonvolatile memory device.

Referring to FIG. 1, a pipe gate 12 is formed on a bottom substrate 11. A first string MS1 and a second string MS2 are formed on the pipe gate 12. The first string MS1 and the second pipe string MS2 are coupled together by a pipe channel 17A to thereby constitute a single memory string.

The first string MS1 and the second string MS2 include a cell stack in which first insulation layers 13 and control gate electrodes 14 are alternately stacked several times. The cell stack and the pipe gate 12 are etched to form a cell channel hole 15 and a pipe channel hole 12A. Due to the cell channel hole 15 and the pipe channel hole 12A, the two strings have a U-shaped string structure. A charge storage or charge trapping layer 16, a cell channel 17, and a second insulation layer 18 are buried in the cell channel hole 15. The charge storage or charge trapping layer 16 includes a blocking layer, a charge trap layer, and a tunnel insulation layer which are sequentially stacked. The cell channel 17 has a pair of columnar structures. The pipe channel 17A couples the bottoms of a pair of cell channels 17. The control gate electrodes 14 of the first string MS1 and the control gate electrodes 14 of the second string MS2 are separated from each other by a slit 19.

In the conventional nonvolatile memory device of FIG. 1, the number of layers of the cell stack must increase in order to increase cell intensity. However, as the number of layers of the cell stack increases, it becomes more difficult to apply a contact etching process and a slit etching process for forming the slit 19. In particular, in the case of the slit etching process, the damage 20 of the pipe gate 12 should ideally be prevented.

However, as the number of layers of the cell stack increases, it is likely that the pipe gate 12 is damaged as indicated by reference numeral 20.

In order to address this concern, a passivation layer may be formed on the pipe gate 12 upon the etching of the cell stack. In this case, however, the gap between the lowermost control gate electrode 14 and the pipe gate 12 increases, thereby lowering the current supplied when a cell is in an "on" state.

SUMMARY OF THE INVENTION

Exemplary embodiments of the present invention are directed to a nonvolatile memory device, which is capable of preventing a lower pipe gate from being damaged during a slit etching process for separating control gate electrodes from each other, and preventing a current supplied when a cell is in an "on" state from being lowered, and a method for fabricating the same.

In accordance with an exemplary embodiment of the present invention, a nonvolatile memory device includes a pipe insulation layer having a pipe channel hole, a pipe gate disposed over the pipe insulation layer, a pair of cell strings each having a columnar cell channel, and a pipe channel coupling the columnar cell channels and surrounding inner sidewalls and a bottom of the pipe channel hole.

In accordance with another exemplary embodiment of the present invention, a nonvolatile memory device includes a first pipe gate having a pipe channel hole, a second pipe gate disposed over the first pipe gate, a pair of cell strings each having a columnar cell channel, and a pipe channel coupling the columnar cell channels and surrounding inner sidewalls and a bottom of the pipe channel hole.

In accordance with yet another exemplary embodiment of the present invention, a method for fabricating a nonvolatile memory device includes forming a pipe insulation layer in which a sacrificial layer is buried, forming a pipe gate over the pipe insulation layer, forming a cell stack having a pair of cell channel holes, removing the sacrificial layer to form a pipe channel hole, forming a pair of columnar cell channels and a pipe channel by partially filling the cell channel holes and the pipe channel hole, and forming a slit which separates the cell stack into cell strings.

In accordance with still another exemplary embodiment of the present invention, a method for fabricating a nonvolatile memory device includes forming a first pipe gate in which a sacrificial layer is buried; forming a second pipe gate and a cell stack having a pair of cell channel holes, removing the sacrificial layer to form a pipe channel hole, forming a pair of columnar cell channels and a pipe channel by partially filling the cell channel holes and the pipe channel hole, and forming a slit which separates the cell stack into cell strings.

DESCRIPTION OF SPECIFIC EMBODIMENTS

Figure 1:
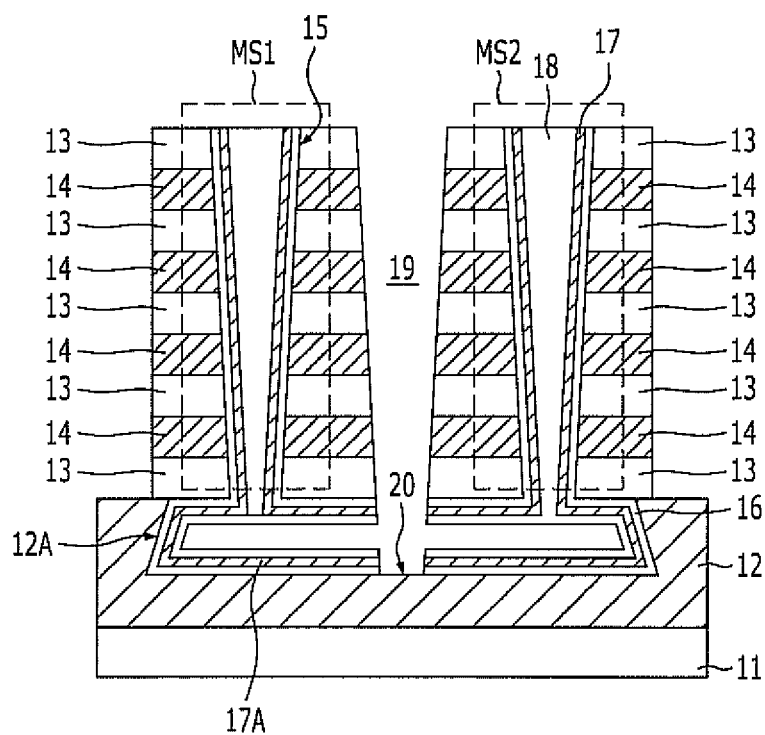
FIG. 1 is a cross-sectional view of a conventional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

In the exemplary embodiments, a memory cell may have a three-dimensional structure, such as a silicon-oxide-nitride-oxide-silicon (SONOS) structure or metal-oxide-nitride-oxide-silicon (MONOS) structure.

Figure 2A:
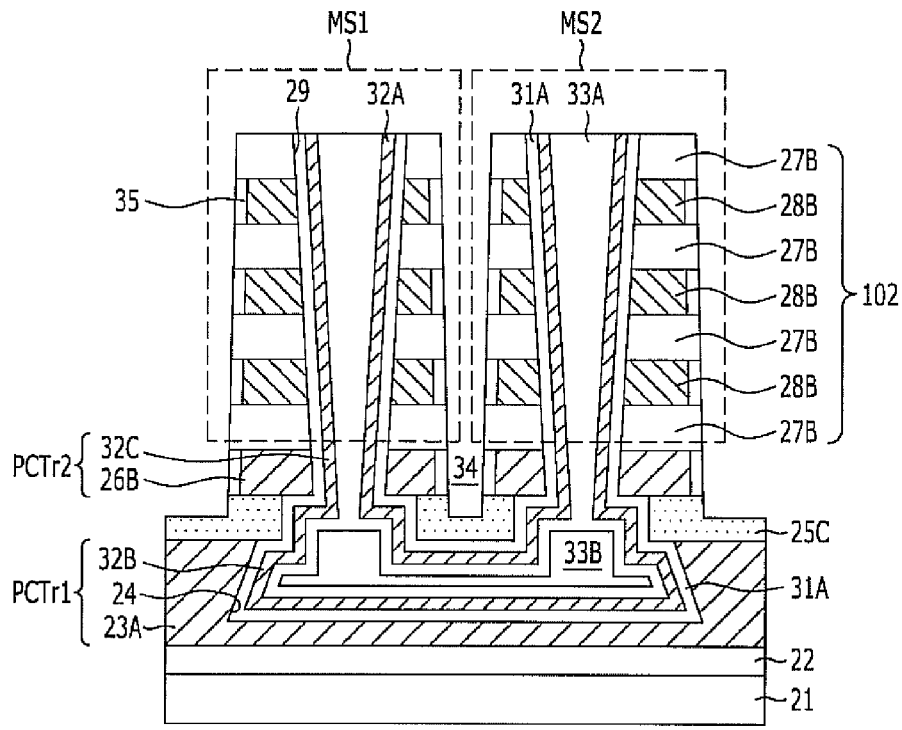
FIG. 2A is a cross-sectional view illustrating a structure of a nonvolatile memory device in accordance with a first exemplary embodiment of the present invention.
Figure 2B:
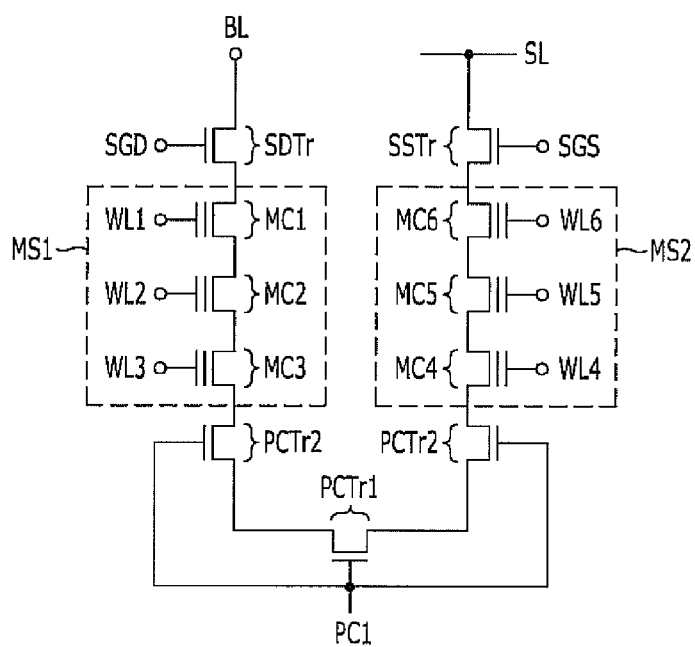
FIG. 2B is an equivalent circuit diagram of the nonvolatile memory device in accordance with the first exemplary embodiment of the present invention.
Figure 2C:
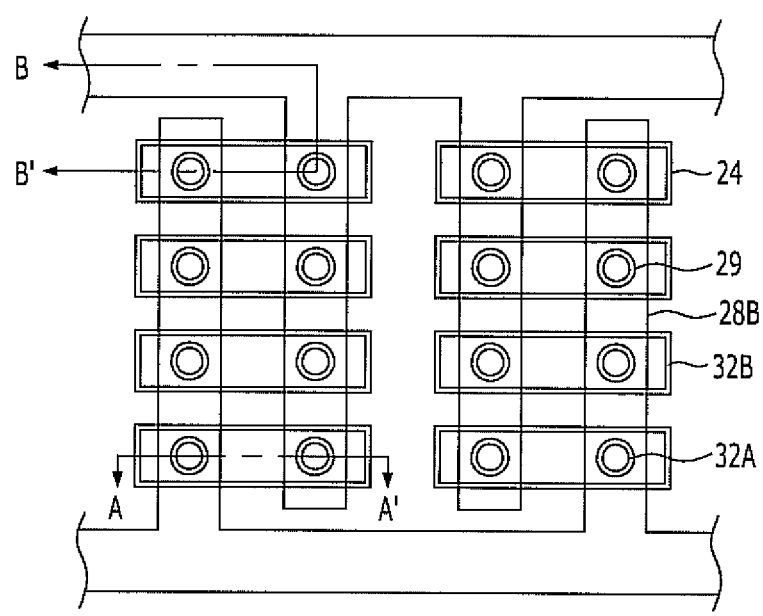
FIG. 2C is a plan view of the nonvolatile memory device in accordance with the first exemplary embodiment of the present invention.

FIG. 2A is a cross-sectional view illustrating a structure of a nonvolatile memory device in accordance with a first exemplary embodiment of the present invention. FIG. 2B is an equivalent circuit diagram of the nonvolatile memory device in accordance with the first exemplary embodiment of the present invention. FIG. 2C is a plan view of the nonvolatile memory device in accordance with the first exemplary embodiment of the present invention. FIG. 2A is a cross-sectional view taken along line A-A' of FIG. 2C.

Referring to FIGS. 2A to 2C, the nonvolatile memory device includes a pair of cell channels 32A protruding from a substrate 21, a first pipe channel 32B coupling the bottoms of the pair of the cell channels 32A, second pipe channels 32C coupling the first pipe channel 32B and the cell channels 32A, a first pipe gate 23A in which the first pipe channel 32B is buried, a second pipe gate 26B surrounding the second pipe channels 32C, and second insulation patterns 27B and control gate electrodes 28B surrounding the cell channels 32A. The control gate electrodes 28B between the cell channels 32A are separated from one another by a slit 34.

Specifically, a first insulation layer 22 is formed between the substrate 21 and the first pipe gate 23A. The first insulation layer 22 may include an oxide layer, such as a silicon oxide layer. The substrate 21 may include a silicon substrate. The first pipe gate 23A may include a silicon layer, in particular, an $N^+$ polysilicon layer.

The cell channels 32A, the first pipe channel 32B, and the second pipe channels 32C are formed of the same material. For example, the cell channels 32A, the first pipe channel 32B, and the second pipe channels 32C may include a polysilicon layer, specifically, an undoped polysilicon layer. The cell channels 32A, the first pipe channel 32B, and the second pipe channels 32C collectively form a U-shaped structure.

The cell channels 32A and the second pipe channels 32C fill cell channel holes 29, and the first pipe channel 32B fills a pipe channel hole 24. The cell channel holes 29 pass through a cell stack 102 in which the control gate electrodes 28B and second insulation patterns 27B are alternately stacked. The pipe channel hole 24 is formed by etching the first pipe gate 23A. A third insulation pattern 33A and a charge storage or charge trapping layer 31A are further formed in the cell channel holes 29 and the pipe channel hole 24. The charge storage or charge trapping layer 31A is formed between the cell channel 32A and the control gate electrode 28B, and the third insulation pattern 33A fills the cell channel holes 29 inside of the cell channels 32A. The charge storage or charge trapping layer 31A includes a blocking layer, a charge trap layer, and a tunnel insulation layer. The third insulation pattern 33A includes an oxide layer, such as a silicon oxide layer. A silicide 35 is formed on a sidewall of the control gate electrode 28B.

The second pipe gate 26B is formed under the lowermost control gate electrode 28B, and a passivation pattern 25C is disposed between the second pipe gate 26B and the first pipe gate 23A. The passivation pattern 25C includes a nitride layer such as a silicon nitride layer. The passivation pattern 25C prevents the first pipe channel 32B and the first pipe gate 23A from being damaged during the formation of the slit 34.

Two memory strings MS1 and MS2 are formed by the slit 34. A first pipe channel transistor PCTr1 is formed by the first pipe gate 23A and the first pipe channel 32B, and two second pipe channel transistors PCTr2 are formed by the second pipe gate 26B and the second pipe channels 32C. The two memory strings MS1 and MS2 are coupled to the first and second pipe channel transistors PCTr1 and PCTr2. The first pipe channel transistor PCTr1 and the second pipe channel transistors PCTr2 are coupled in series. Consequently, the two memory strings MS1 and MS2 are coupled in series through the first and second pipe channel transistors PCTr1 and PCTr2 to thereby constitute a single memory cell string. For example, where three memory cells are formed in each memory string, the single memory cell string includes six memory cells.

Referring to FIG. 2B, the nonvolatile memory device in accordance with the first exemplary embodiment of the present invention includes two memory strings MS1 and MS2, two second pipe channel transistors PCTr2, and one first pipe channel transistor PCTr1. In addition, the nonvolatile memory device includes a source select transistor SSTr and a drain select transistor SDTr. The drain select transistor SDTr is coupled to a bit line BL, and the source select transistor SSTr is coupled to a source line SL. Further, although FIG. 2B shows the source select transistor SSTr coupled to the second memory string MS2 and the drain select transistor SDTr coupled to the first memory string MS1, the nonvolatile memory device may be constructed vice versa. That is, the source select transistor SSTr may be coupled to the first memory string MS1 and the drain select transistor SDTr may be coupled to the second memory string MS2. The source select transistor SSTr, the drain select transistor SDTr, the bit line BL, and the source line SL are not illustrated in FIG. 2A. Gates of the first pipe channel transistor PCTr1 and the second pipe channel transistor PCTr2 are commonly coupled, and a signal PC1 is commonly inputted therethrough. Reference symbol "SGD" represents a signal which is applied to the gate of the drain select transistor SDTr, and reference symbol "SGS" represents a signal which is applied to the gate of the source select transistor SSTr.

The first memory string MS1 includes three memory cells MC1, MC2 and MC3 coupled to word lines WL1 to WL3, and the second memory string MS2 includes three memory cells MC4, MC5 and MC6 coupled to word lines WL4 to WL6.

FIGS. 3A to 3J are cross-sectional views illustrating a method for fabricating a three-dimensional nonvolatile memory device in accordance with the first exemplary embodiment of the present invention. FIGS. 3A to 3J are cross-sectional views taken along line A-A' of FIG. 2C.

Figure 3A:
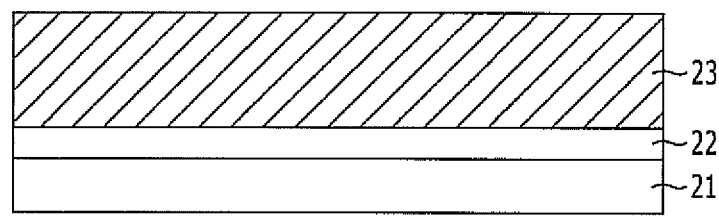
FIGS. 3A to 3J are cross-sectional views illustrating a method for fabricating a nonvolatile memory device in accordance with the first exemplary embodiment of the present invention.

Referring to FIG. 3A, a first conductive layer 23 is formed on a substrate 21. The substrate 21 may include a silicon substrate. A first insulation layer 22 is formed between the substrate 21 and the first conductive layer 23. The first insulation layer 22 may include an oxide layer. The first conductive layer 23 may include a silicon layer, in particular, an $N^+$ polysilicon layer. The first conductive layer 23 is used as a first pipe gate.

Figure 3B:
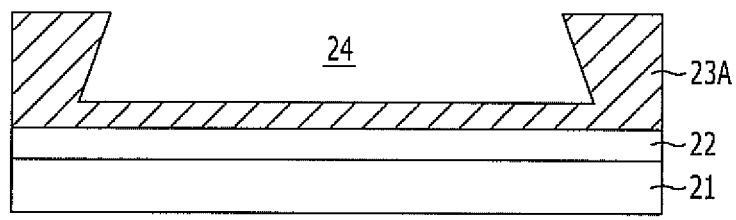

Referring to FIG. 3B, the first conductive layer 23 is etched to form a pipe channel hole 24. As a result of the etch, a first pipe gate 23A is formed. In order to form the pipe channel hole 24, the first conductive layer 23 may be etched using an anisotropic etching process or an isotropic etching process. In this embodiment, the pipe channel hole 24 is formed using an isotropic etching process.

Figure 3C:
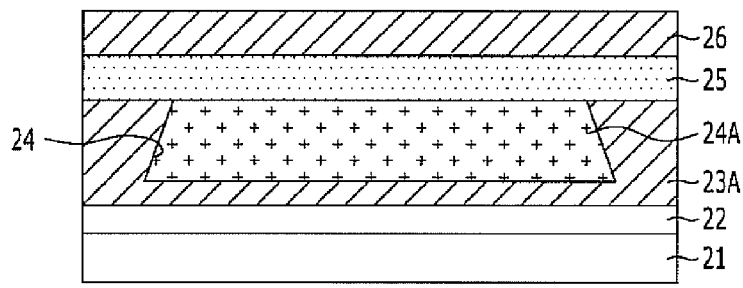

Referring to FIG. 3C, a sacrificial layer 24A is formed to gap-fill the pipe channel hole 24. The sacrificial layer 24A includes an insulation layer, such as, for example, an oxide layer. After forming the sacrificial layer 24A over a resulting structure until it gap-fills the pipe channel hole 24, a planarization process, such as a chemical mechanical polishing (CMP) process, may be performed. The CMP process is stopped at the first pipe gate 23A.

A passivation layer 25 is formed over a resulting structure, including the sacrificial layer 24A and the first pipe gate 23A. The passivation layer 25 is used as an etch stop layer during a subsequent slit etching process. The passivation layer 25 may include a nitride layer.

A second conductive layer 26 is formed on the passivation layer 25. The second conductive layer 26 may include a silicon layer, in particular, an $N^+$ polysilicon layer. The second conductive layer 26 is used as a second pipe gate.

Figure 3D:
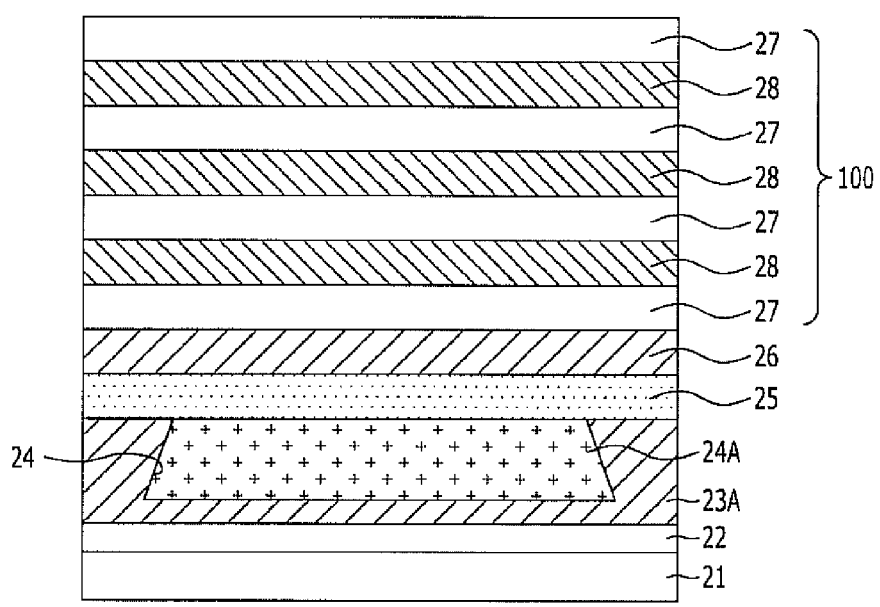

Referring to FIG. 3D, a cell stack 100, in which second insulation layers 27 and third conductive layers 28 are alternately stacked, is formed on the second conductive layer 26. The second insulation layers 27 separate control gate electrodes of a plurality of memory cells stacked over the substrate 21. The second insulation layers 27 may include an oxide layer. The uppermost layer of the cell stack 100 is the second insulation layer 27. Also, the third conductive layers 28 are used as the control gate electrodes of the memory cells, and therefore, may include a polysilicon layer doped with a P-type impurity or N-type impurity. In this exemplary embodiment, the third conductive layers 28 include a polysilicon layer doped with a P-type impurity, that is, a $P^+$ polysilicon layer. The second insulation layers 27 and the third conductive layers 28 are repetitively formed according to the number of the memory cells desired to be stacked. Although any number of memory cells may be stacked, for convenience of explanation, with regards to the first exemplary embodiment of the present invention, the memory strings each include three stacked memory cells, and therefore, the memory cell string includes six memory cells. Furthermore, a third conductive layer for a select transistor may be further stacked although its illustration is omitted.

Figure 3E:
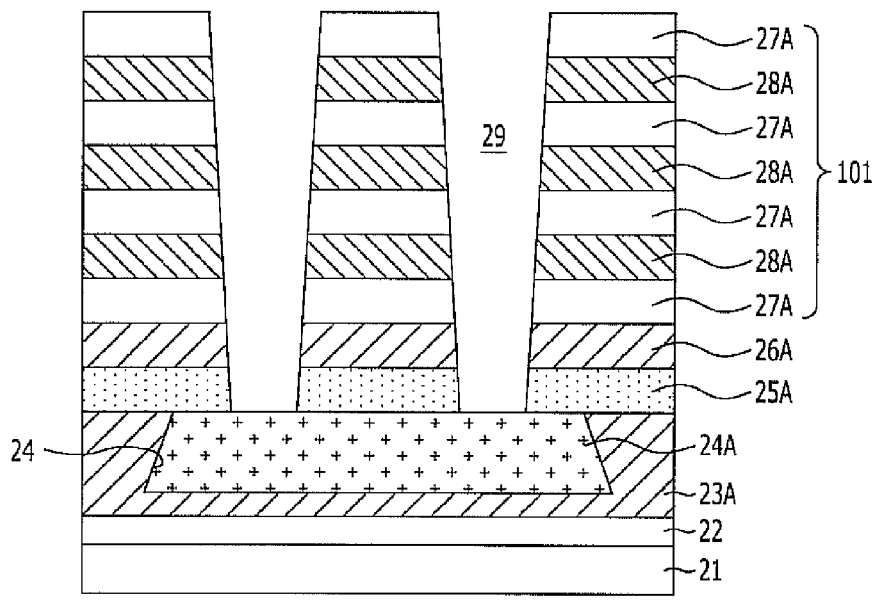

Referring to FIG. 3E, the cell stack 100 is etched to form two cell channel holes 29 exposing two separate portions of the surface of the sacrificial layer 24A. The cell channel holes 29 are formed to pass through the cell stack 100, the second conductive layer 26, and the passivation layer 25. As a result of forming the cell channel holes 29, a cell stack 101 having a structure in which second insulation patterns 27A and third conductive patterns 28A are alternately stacked, a passivation pattern 25A, and a second conductive pattern 26A are formed. The cell channel holes 29 pass through the second insulation patterns 27A, the third conductive patterns 28A, the second conductive pattern 26A, and the passivation pattern 25A. Before forming the cell channel holes 29, the ends of the third conductive patterns 28A may be etched using, for example, a slimming etching process, to form a stepped shape structure (not illustrated). The stepped portions may become a contact region between a word line and a control gate electrode.

Figure 3F:
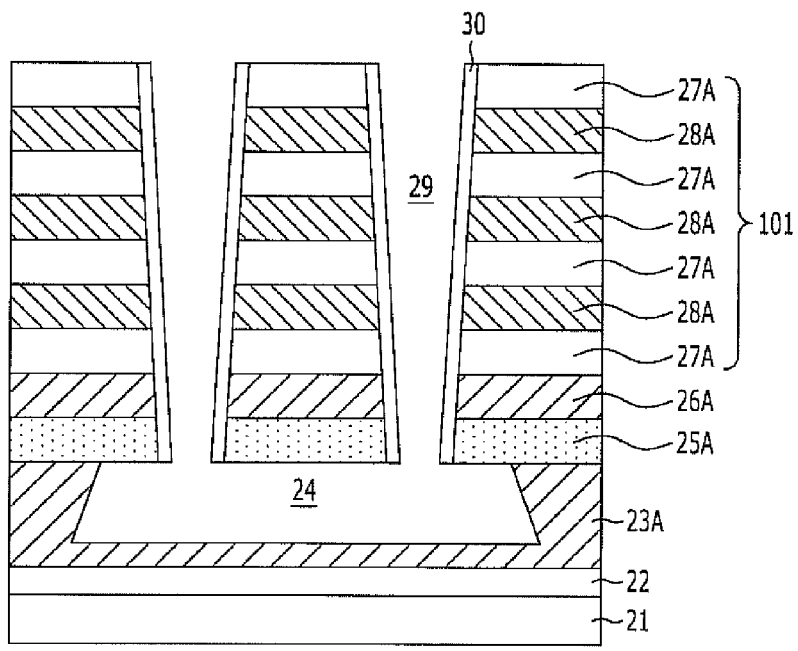

Referring to FIG. 3F, spacers 30 are formed on both sidewalls of the cell channel holes 29. The spacers 30 are formed by depositing a nitride layer and performing an etch-back process on the deposited nitride layer. The spacers 30 expose the surface of the sacrificial layer 24A, and protect both sidewalls of the cell channel holes 29.

Next, the sacrificial layer 24A is removed. Accordingly, the pipe channel hole 24 is again opened. The spacers 30 protect the third conductive patterns 28A, the second insulation patterns 27A, the second conductive pattern 26A, and the passivation pattern 25A, while the sacrificial layer 24A is removed.

More specifically, the sacrificial layer 24A is removed such that the pipe channel hole 24 forms an opening between the adjacent cell channel holes 29. Thus, the cell channel holes 29 and the pipe channel hole 24 collectively form a U-shaped opening.

Figure 3G:
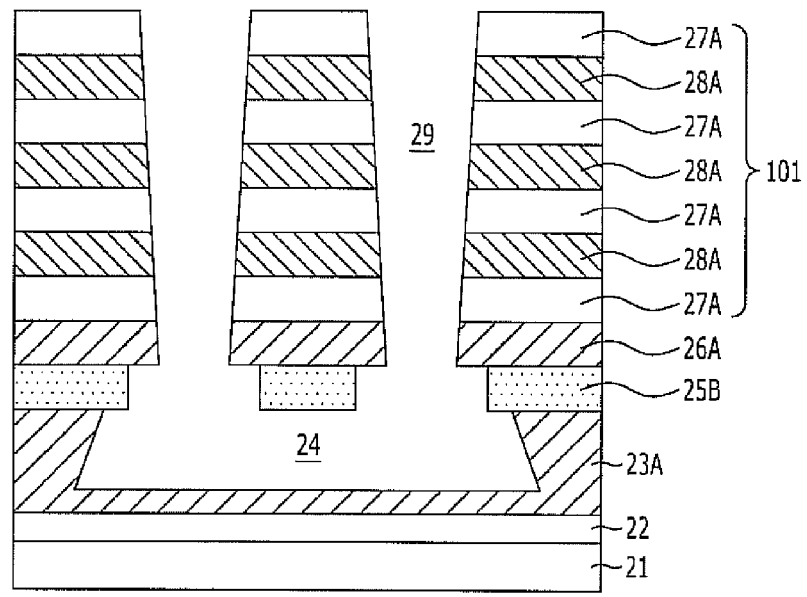

Referring to FIG. 3G, the spacers 30 are removed. When removing the spacers 30, the passivation pattern 25A using the nitride layer may also be partially removed. The remaining passivation pattern is indicated by reference numeral "25B". The spacers 30 may be removed by a wet process, in particular, a wet strip process. Accordingly, only the spacers 30 formed of nitride may be selectively removed without causing damage to the third conductive patterns 28A and the second insulation patterns 27A.

Figure 3H:
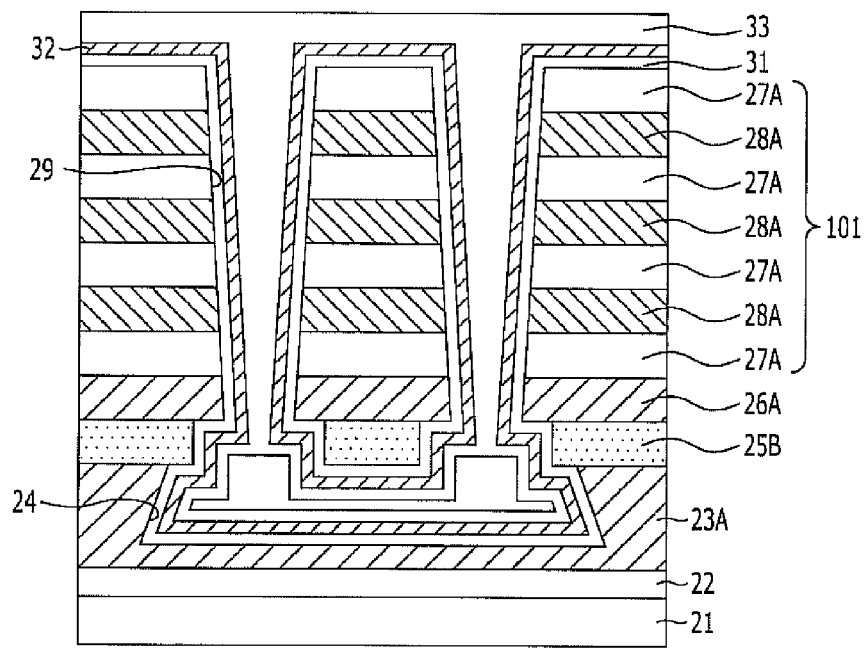

Referring to FIG. 3H, after removing the spacers 30, a charge storage or charge trapping layer 31 is formed on the resulting structure, including the pipe channel hole 24. Preferably, the charge storage or charge trapping layer 31 is formed to conform to cover all surfaces exposed by the cell channel holes 29 and pipe channel hole 24. The charge storage or charge trapping layer 31 may include a blocking layer, a charge trap layer, and a tunnel insulation layer. That is, the charge storage or charge trapping layer 31 may be formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer. Therefore, the charge storage or charge trapping layer 31 may have an oxide-nitride-oxide (ONO) structure.

A fourth conductive layer 32 is formed on the charge storage or charge trapping layer 31. Preferably, the fourth conductive layer 32 is formed to conform to cover all surfaces exposed by the cell channel holes 29 and pipe channel hole 24. The fourth conductive layer 32 may include a silicon layer. In particular, the fourth conductive layer 32 includes a polysilicon layer, specifically, an undoped polysilicon layer. The fourth conductive layer 32 is used as a cell channel of the memory cell.

A third insulation layer 33 is formed on the fourth conductive layer 32. The third insulation layer 33 may include an oxide layer. The third insulation layer 33 is formed to gap-fill the cell channel holes 29. However, when forming the third insulation layer 33, the bottom of the cell channel hole 29 is sealed, before the pipe channel hole 24 is completely filled. Accordingly, a hollow region is formed inside the pipe channel hole 24.

Figure 3I:
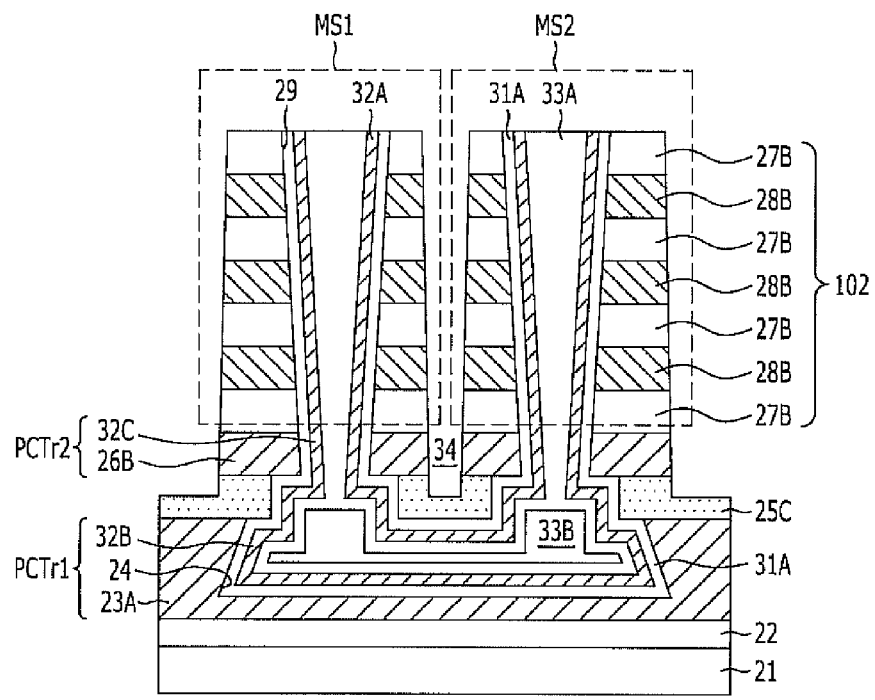

Referring to FIG. 3I, a planarization process is performed to expose the uppermost second insulation pattern 27A of the cell stack 101. The planarization process may include a CMP process. Specifically, the third insulation layer 33, the fourth conductive layer 32, and the charge storage or charge trapping layer 31 are planarized.

Due to such a planarization process, the fourth conductive layer 32 becomes the columnar cell channels 32A, which are formed within the cell channel holes 29, the charge storage or charge trapping layer 31 becomes the planarized charge storage or charge trapping layer 31A, and the third insulation layer 33 becomes the third insulation pattern 33A. Also, a first pipe channel 32B is formed within the pipe channel hole 24. A second pipe channel 32C is formed to couple the cell channel 32A and the first pipe channel 32B. Further, the first and second pipe channels 32B and 32C couple the cell channels 32A of adjacent memory strings MS1 and MS2. Accordingly, the cell channel 32A, the first pipe channel 32B, and the second pipe channel 32C collectively form a U-shaped structure. Also, even after the planarization process, the third insulation pattern 33A remains to form a hollow region 33B inside of the pipe channel hole 24.

A slit etching process is performed in order to separate the control gate electrodes 28B between the adjacent memory strings MS1 and MS2. As a result, a slit 34 is formed. In order to form the slit 34, the second insulation patterns 27A, the third conductive patterns 28A, and the second conductive pattern 26A are sequentially etched, and the etching is stopped at the passivation pattern 25B. A portion of the passivation pattern 25B may be removed, leaving the remaining passivation pattern 25C. However, since the passivation pattern 25B sufficiently serves as the etch stop layer, the slit 34 does not pass through the underlying pipe channel 32B.

As such, when the slit 34 is formed, the cell stack is separated as indicated by reference numeral "102". The separated cell stack 102 becomes two memory strings MS1 and MS2 in which the second insulation patterns 27B and the control gate electrodes 28B are alternately stacked. The memory strings MS1 and MS2 include the charge storage or charge trapping layers 31A and the cell channels 32A buried in the cell channel holes 29.

A second pipe gate 26B is formed between the memory strings MS1 and MS2 and the first pipe gate 23A, and the passivation pattern 25C remains between the second pipe gate 26B and the first pipe gate 23A. The adjacent cell channels 32A are coupled together through the first and second pipe channels 32B and 32C. The first pipe channel 32B is buried within the pipe channel hole 24, and the second pipe channel 32C is buried in the cell channel holes 29 under the memory strings MS1 and MS2. The regions between the first pipe channel 32B and the regions between the second pipe channel 32C may be empty. That is, the third insulation pattern 33A may not be between the first pipe channel 32B and the second pipe channel 32C. The second pipe gate 26B and the second pipe channel 32C form a second pipe channel transistor PCTr2, and the first pipe gate 23A and the first pipe channel 32B form a first pipe channel transistor PCTr1.

Due to the passivation pattern 25C, the first pipe channel 32B and the first pipe gate 23A are not damaged during the slit etching process.

Figure 3J:
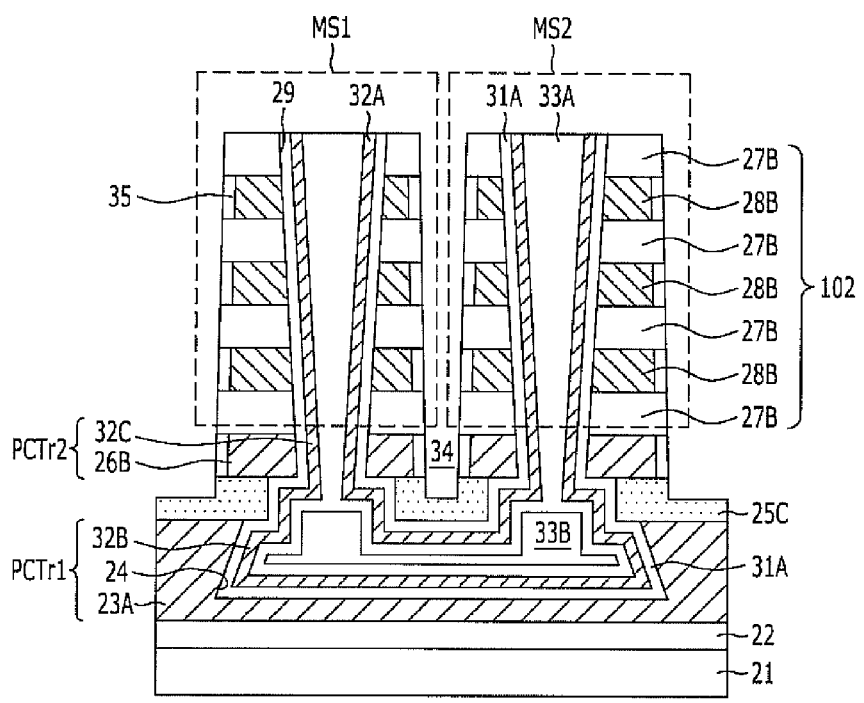

Referring to FIG. 3J, a silicide 35 is formed on a sidewall of the control gate electrodes 28B exposed by the slit 34.

In accordance with the first exemplary embodiment described above, the etching is stopped by at least the passivation pattern 25C during the slit etching process for forming the slit 34. Accordingly, the damage of the first pipe channel 32B and the first pipe gate 23A is prevented, thereby improving an etching margin. In the first exemplary embodiment, although the etching is stopped in the passivation pattern 25C during the slit etching process, the etching may also be stopped in any one of the passivation pattern 25C, the second pipe gate 26B, and the lowermost third insulation pattern 27B.

In the first exemplary embodiment, as the passivation pattern 25C is inserted, the channel length between the lowermost memory cell and the first pipe channel transistor PCTr1 may increase. However, the increase in the channel distance is prevented by forming the second pipe gate 26B and the second pipe channel 32C under the memory string. Thus, the cell on current is not lowered. Herein, the "cell on current" refers to the current flowing through a single memory cell string, including two memory strings, when a selected memory cell of the memory cell string is in the "on" state.

Figure 3K:
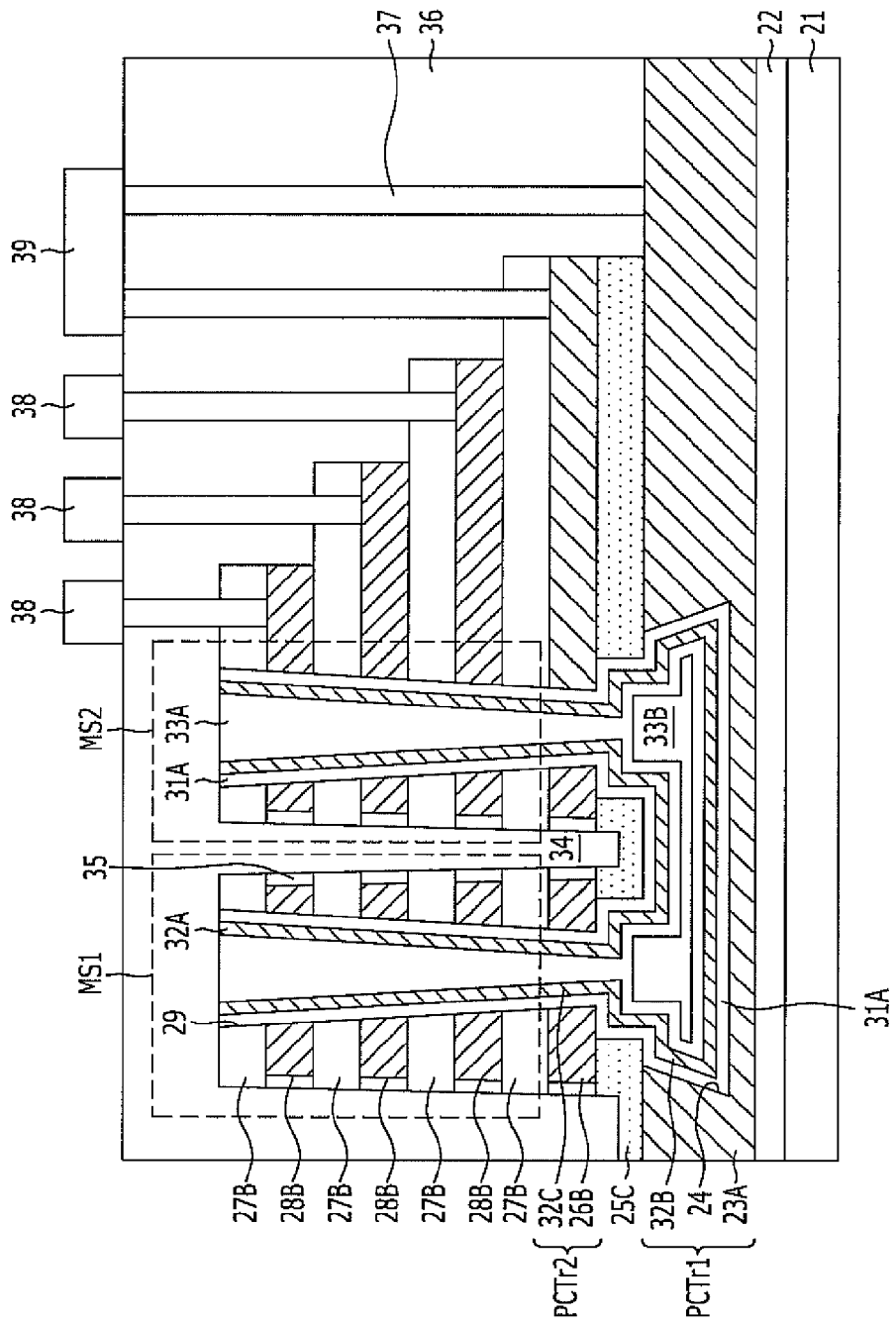
FIG. 3K is a diagram of the nonvolatile memory device in accordance with the first exemplary embodiment of the present invention illustrating possible connections.

FIG. 3K is a diagram of the nonvolatile memory device in accordance with the first exemplary embodiment of the present invention illustrating possible connections. FIG. 3K is a cross-sectional view taken along line B-B' of FIG. 2C.

Referring to FIG. 3K, the ends of the control gate electrodes 28B are formed in a stepped shape. Word lines 38 for applying word line signals are coupled to respective control gate electrodes 28B. The first pipe gate 23A and the second pipe gate 26B are commonly coupled by a single metal interconnection 39. More specifically, the word lines 38 and the metal interconnection 39 are coupled to corresponding plugs 37 passing through an interlayer dielectric layer 36.

The semiconductor memory device in accordance with the first exemplary embodiment of the present invention includes the first pipe gate 23A and the second pipe gate 26B. The etching is stopped by at least the passivation pattern 25C during the etching of the slit 34. Furthermore, the increase in the channel distance is compensated for by further forming the second pipe gate 26B under the memory strings.

Figure 4:
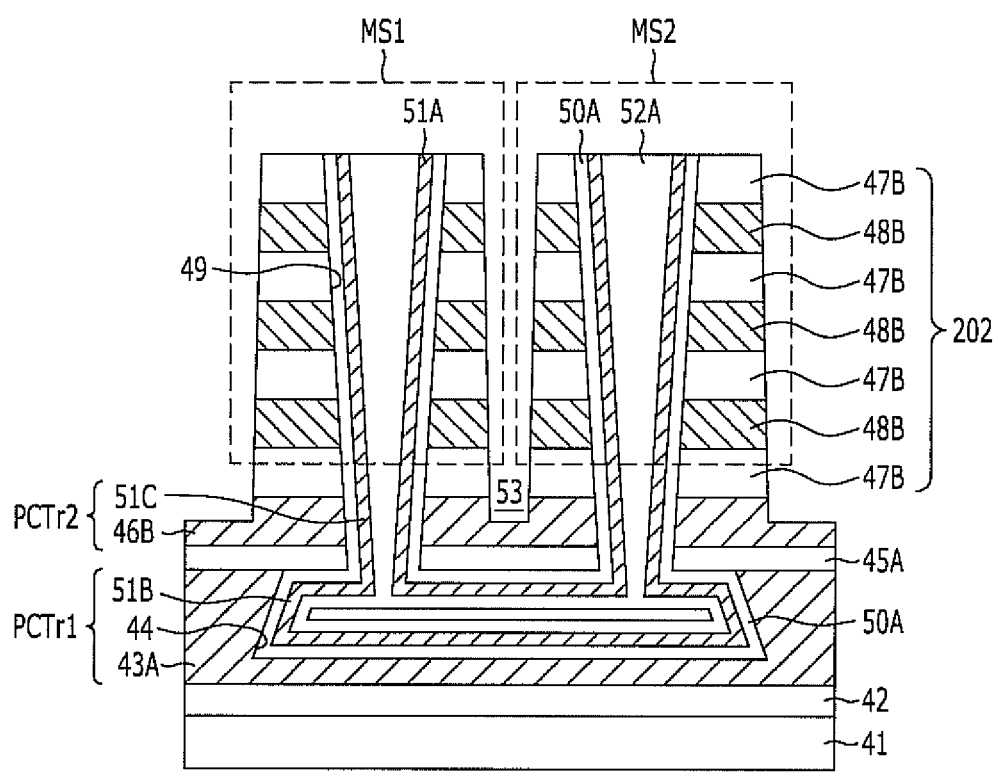
FIG. 4 is a cross-sectional view illustrating a structure of a nonvolatile memory device in accordance with a second exemplary embodiment of the present invention.

FIG. 4 is a cross-sectional view illustrating a structure of a nonvolatile memory device in accordance with a second exemplary embodiment of the present invention.

Referring to FIG. 4, the nonvolatile memory device includes a pair of cell channels 51A protruding from a substrate 41, a first pipe channel 51B coupling the bottoms of the pair of the cell channels 51A, second pipe channels 51C coupling the first pipe channel 51B and the cell channels 51A, a first pipe gate 43A in which the first pipe channel 51B is buried, a second pipe gate 46B surrounding the second pipe channels 51C, and control gate electrodes 48B surrounding the cell channels 51A. The control gate electrodes 48B between the cell channels 51A are separated from one another by a slit 53.

Specifically, a first insulation layer 42 is formed between the substrate 41 and the first pipe gate 43A. The first insulation layer 42 may include an oxide layer, such as a silicon oxide layer. The substrate 41 may include a silicon substrate. The first pipe gate 43A may include a silicon layer, in particular, an N$^+$ polysilicon layer.

The cell channels 51A, the first pipe channel 5113, and the second pipe channels 51C are formed of the same material. For example, the cell channels 51A, the first pipe channel 51B, and the second pipe channels 51C may include a polysilicon layer, specifically, an undoped polysilicon layer. The cell channels 51A, the first pipe channel 51B, and the second pipe channels 51C collectively form a U-shaped structure.

The cell channels 51A and the second pipe channels 51C fill cell channel holes 49, and the first pipe channel 51B fills a pipe channel hole 44. The cell channel holes 49 pass through a cell stack 202 in which the control gate electrodes 48B and third insulation patterns 47B are alternately stacked. The pipe channel hole 44 is formed by etching the first pipe gate 43A. A fourth insulation pattern 52A and a charge storage or charge trapping layer 50A are further formed in the cell channel holes 49 and the pipe channel hole 44. The charge storage or charge trapping layer 50A is formed between the cell channel 51A and the control gate electrode 48B, and the fourth insulation pattern 52A fills the cell channel holes 49 inside of the cell channels 51A. The charge storage or charge trapping layer 50A includes a blocking layer, a charge trap layer, and a tunnel insulation layer. The fourth insulation pattern 52A includes an oxide layer, such as a silicon oxide layer.

The second pipe gate 46B is formed under the lowermost control gate electrode 48B, and a second insulation pattern 45A is disposed between the second pipe gate 46B and the first pipe gate 43A. The second insulation pattern 45A may include an oxide layer, such as a silicon oxide layer. The second insulation pattern 45A prevents the first pipe channel 51B and the first pipe gate 43A from being damaged during the formation of the slit 53.

Two memory strings MS1 and MS2 are formed by the slit 53. A first pipe channel transistor PCTr1 is formed by the first pipe gate 43A and the first pipe channel 51B, and two second pipe channel transistors PCTr2 are formed by the second pipe gate 46B and the second pipe channels 51C. The two memory strings MS1 and MS2 are coupled to the first and second pipe channel transistors PCTr1 and PCTr2. The first pipe channel transistor PCTr1 and the second pipe channel transistors PCTr2 are coupled in series. Consequently, the two memory strings MS1 and MS2 are coupled in series through the first and second pipe channel transistors PCTr1 and PCTr2 to thereby constitute a single memory cell string. For example, where three memory cells are formed in each memory string, the single memory cell string includes six memory cells.

FIGS. 5A to 5H are cross-sectional views illustrating a method for fabricating a nonvolatile memory device in accordance with the second exemplary embodiment of the present invention. FIGS. 5A to 5H are cross-sectional views taken along the same direction as that of the line A-A' of FIG. 2C.

Figure 5A:
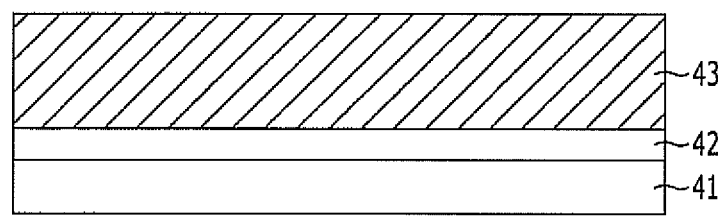
FIGS. 5A to 5H are cross-sectional views illustrating a method for fabricating a nonvolatile memory device in accordance with the second exemplary embodiment of the present invention.

Referring to FIG. 5A, a first conductive layer 43 is formed on a substrate 41. The substrate 41 may include a silicon substrate. A first insulation layer 42 is formed between the substrate 41 and the first conductive layer 43. The first insulation layer 42 may include an oxide layer, such as a silicon oxide layer. The first conductive layer 43 may include a silicon layer, in particular, an N$^+$ polysilicon layer. The first conductive layer 43 is used as a first pipe gate.

Figure 5B:
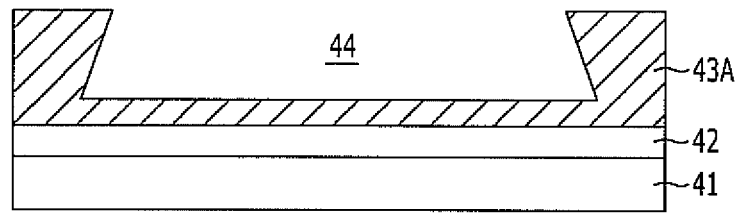

Referring to FIG. 5B, the first conductive layer 43 is etched to form a pipe channel hole 44. As a result of the etch, a first pipe gate 43A is formed. In order to form the pipe channel hole 44, the first conductive layer 43 may be etched using an anisotropic etching process or an isotropic etching process. In this embodiment, the pipe channel hole 44 is formed using an isotropic etching process.

Figure 5C:
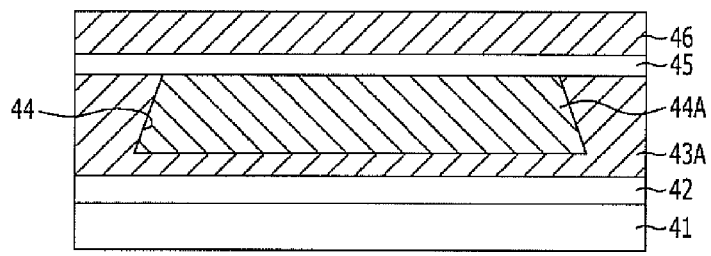

Referring to FIG. 5C, a sacrificial layer 44A is formed to gap-fill the pipe channel hole 44. The sacrificial layer 44A includes an insulation layer, such as, for example, a silicon nitride layer. After forming the sacrificial layer 44A over a resulting structure until it gap-fills the pipe channel hole 44, a planarization process, such as a chemical mechanical polishing (CMP) process, may be performed.

A second insulation layer 45 is formed over a resulting structure, including the sacrificial layer 44A and the first pipe gate 43A. The second insulation layer 45 serves as an insulation layer between the first pipe gate 43A and a subsequently formed second pipe gate. Also, the second insulation layer 45 is used as a passivation layer during a subsequent slit etching process. The second insulation layer 45 may include an oxide layer, such as a silicon oxide layer. The second insulation layer 45 is formed to a minimal thickness in order to function as insulation between the first pipe gate 43A and the second pipe gate.

A second conductive layer 46 is formed on the second insulation layer 45. The second conductive layer 46 may include a silicon layer, in particular, an N$^+$ polysilicon layer. The second conductive layer 46 is used as a second pipe gate.

Figure 5D:
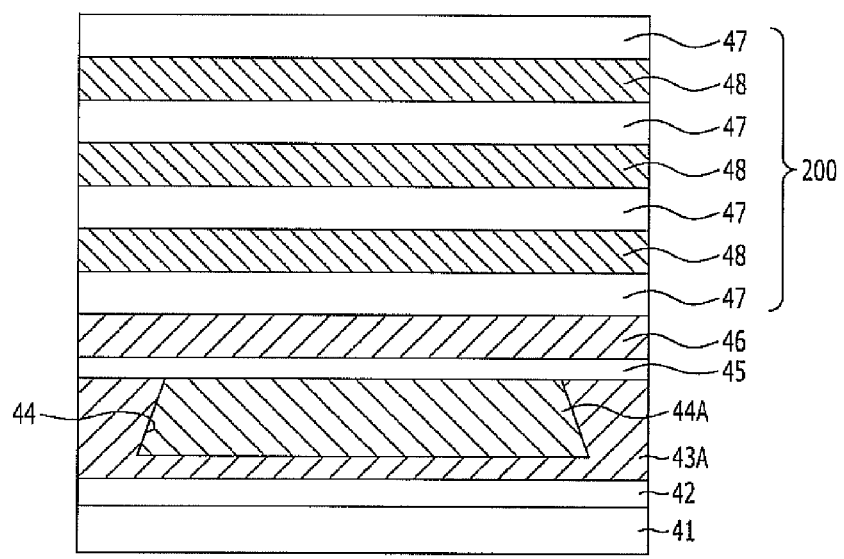

Referring to FIG. 5D, a cell stack 200, in which third insulation layers 47 and third conductive layers 48 are alternately stacked, is formed on the second conductive layer 46. The third insulation layers 47 separate control gate electrodes of a plurality of memory cells stacked over the substrate 41. The third insulation layers 47 may include an oxide layer. The uppermost layer of the cell stack 200 is the third insulation layer 47. Also, the third conductive layers 48 are used as the control gate electrodes of the memory cells, and therefore, may include a polysilicon layer doped with a P-type impurity or N-type impurity. In this exemplary embodiment, the third conductive layers 48 include a polysilicon layer doped with a P-type impurity, that is, a P$^+$ polysilicon layer. The third insulation layers 47 and the third conductive layers 48 are repetitively formed according to the number of the memory cells desired to be stacked. Although any number of memory cells may be stacked, for convenience of explanation, with regards to the second exemplary embodiment of the present invention, the memory strings each include three stacked memory cells, and therefore, the memory cell string includes six memory cells.

Figure 5E:
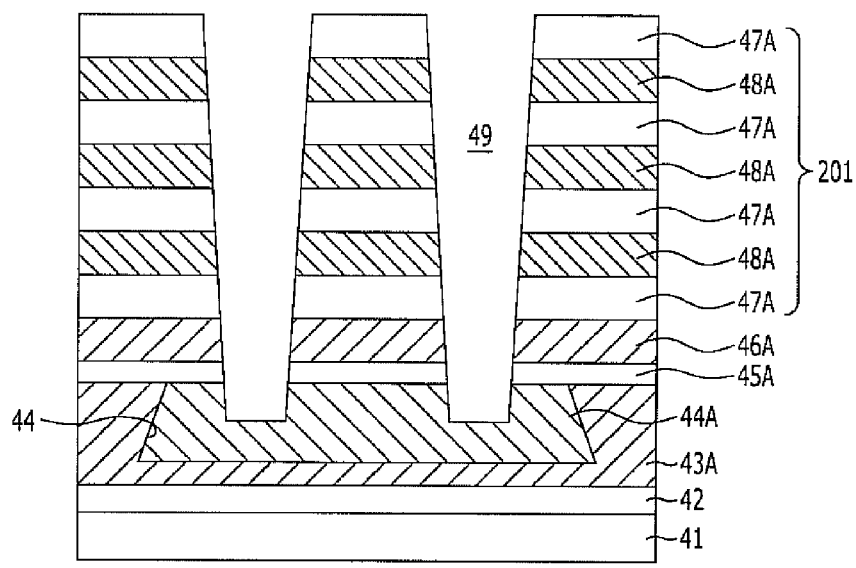

Referring to FIG. 5E, the cell stack 200 is etched to form two cell channel holes 49 exposing two separate portions of the surface of the sacrificial layer 44A. The cell channel holes 49 are formed to pass through the cell stack 200, the second conductive layer 46, and the second insulation layer 45. As a result of forming the cell channel holes 49, a cell stack 201 having a structure in which third insulation patterns 47A and third conductive patterns 48A are alternately stacked, a second insulation pattern 45A, and a second conductive pattern 46A are formed.

The cell channel holes 49 pass through the third insulation patterns 47A, the third conductive patterns 48A, the second conductive pattern 46A, and the second insulation pattern 45A. Before forming the cell channel holes 49, the ends of the third conductive patterns 48A may be etched using, for example, a slimming etching process, to form a stepped shape structure (not illustrated). Meanwhile, a lower end of the cell channel holes 49 may extend up to the sacrificial pattern 44A. However, since a sacrificial pattern 44A serves as a passivation layer, the cell channel holed 49 do not pass through the first pipe gate 43A, but rather stop in the sacrificial pattern 44A.

Figure 5F:
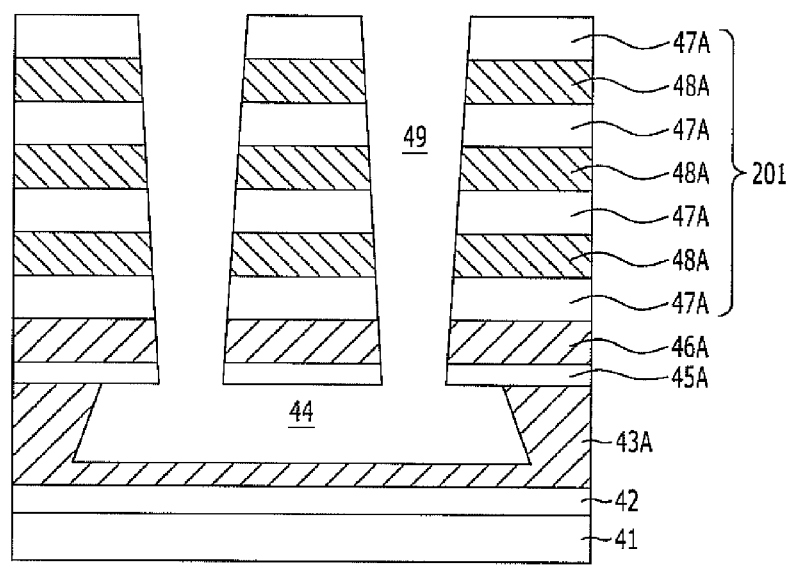

Referring to FIG. 5F, the sacrificial layer 44A is removed. Accordingly, the pipe channel hole 44 is again opened.

The sacrificial layer 44A may be removed by a wet process, in particular, a wet strip process. Accordingly, only the sacrificial layer 44A formed of nitride may be selectively removed without causing damage to the third conductive patterns 48A, the third insulation pattern 47A, the second conductive pattern 46A, and the second insulation pattern 45A.

Figure 5G:
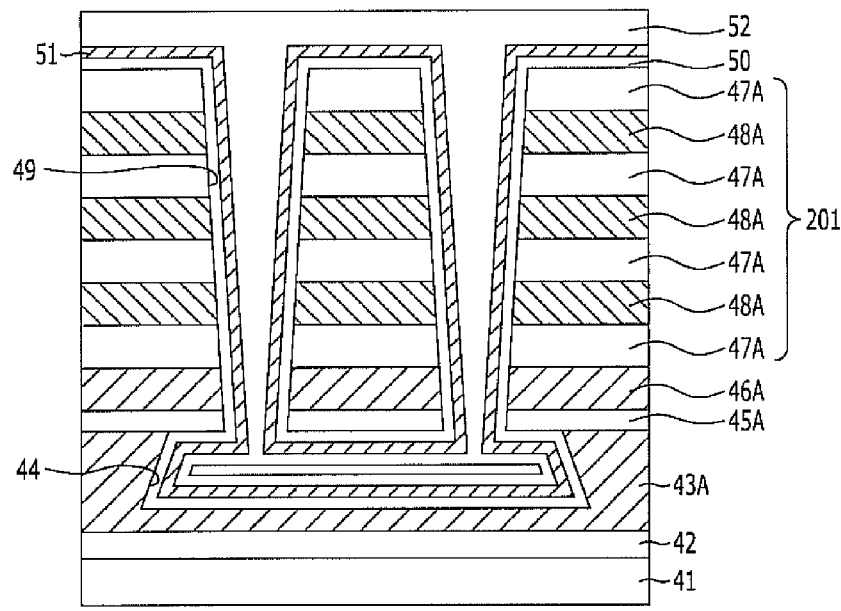

Referring to FIG. 5G, after removing the sacrificial layer 44A, a charge storage or charge trapping layer 50 is formed on the resulting structure, including the pipe channel hole 44. Preferably, the charge storage or charge trapping layer is formed to cover all surfaces exposed by the cell channel holes 49 and the pipe channel hole 44. The charge storage or charge trapping layer 50 may include a blocking layer, a charge trap layer, and a tunnel insulation layer. That is, the charge storage or charge trapping layer 50 may be formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer.

A fourth conductive layer 51 is formed on the charge storage or charge trapping layer 50. Preferably, the fourth conductive layer 51 is formed to conform to cover all surfaces exposed by the cell channel holes 49 and pipe channel hole 44. The fourth conductive layer 51 may include a silicon layer. In particular, the fourth conductive layer 51 includes a polysilicon layer, specifically, an undoped polysilicon layer. The fourth conductive layer 51 is used as a cell channel of the memory cell.

A fourth insulation layer 52 is formed on the fourth conductive layer 51. The fourth insulation layer 52 includes an oxide layer. The fourth insulation layer 52 is formed to gap-fill the cell channel holes 49.

Figure 5H:
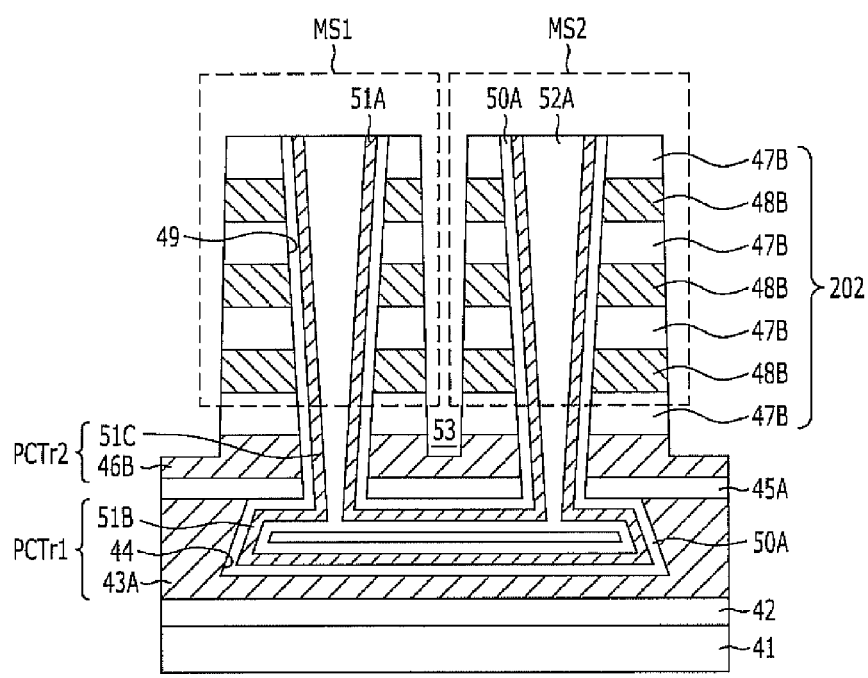

Referring to FIG. 5H, a planarization process is performed to expose the uppermost third insulation pattern 47A of the cell stack 201. The planarization process may include a CMP process. Specifically, the fourth insulation layer 52, the fourth conductive layer 51, and the charge storage or charge trapping layer 50 are planarized.

Due to such a planarization process, the fourth conductive layer 51 becomes the columnar cell channels 51A, which are formed within the cell channel holes 49, the charge storage or charge trapping layer 50 becomes the planarized charge storage or charge trapping layer 50A, and the fourth insulation layer 52 becomes the fourth insulation pattern 52A. Also, a first pipe channel 51B is formed within the pipe channel hole 44. Two second pipe channels 51C are formed to couple the cell channel 51A and the first pipe channel 51B. Further, the first and second pipe channels 51B and 51C couple the cell channels 51A of adjacent memory strings MS1 and MS2. Accordingly, the cell channels 51A, the first pipe channel 51B, and the second pipe channels 51C collectively form a U-shaped structure. Also, even after the planarization process, the fourth insulation pattern 52A remains to form a hollow region inside of the pipe channel hole 44.

A slit etching process is performed in order to separate the control gate electrodes 48B between the adjacent memory strings MS1 and MS2. As a result, a slit 53 is formed. Due to the slit 53, the cell stack is separated as indicated by reference numeral "202". In order to form the slit 53, the third insulation patterns 47A, the third conductive patterns 48A, and the second conductive pattern 46A are sequentially etched, and the etching is stopped at the second conductive pattern 46A. A portion of the second conductive pattern 46A may be removed, leaving the remaining second conductive patter 46B. However, the slit 53 does not pass through the underlying first pipe channel 51B.

As such, when the slit 53 is formed, two memory strings MS1 and MS2 in which the third insulation patterns 47B and the control gate electrodes 48B are alternately stacked are formed. The memory strings MS1 and MS2 include the charge storage or charge trapping layers 50A and the cell channels 51A buried in the cell channel holes 49.

A second pipe gate 46B is formed between the memory strings MS1 and MS2 and the first pipe gate 43A, and the second insulation pattern 45A remains between the second pipe gate 46B and the first pipe gate 43A. The adjacent cell channels 51A are coupled together through the first and second pipe channels 51B and 51C. The first pipe channel 51B is buried within the pipe channel hole 44, and the second pipe channel 52C is buried in the cell channel holes 49 under the memory strings MS1 and MS2. The second pipe gate 46B and the second pipe channels 51C form two second pipe channel transistor PCTr2, and the first pipe gate 43A and the first pipe channel 51B form a first pipe channel transistor PCTr1.

Due to at least the second pipe gate 46B, the first pipe channel 51B and the first pipe gate 43A are not damaged during the slit etching process. In other words, the etching may be stopped at any one of the second pipe gate 46B, the second insulation pattern 45A, and the lowermost third insulation pattern 47B during the slit etching process. Therefore, the first pipe channel 51B and the first pipe gate 43A are not damaged. The second insulation pattern 45A serves as the passivation layer just like the passivation pattern of the first exemplary embodiment which is formed of nitride.

A silicide (not shown) is formed on a sidewall of the control gate electrodes 48B exposed by the slit 53.

The semiconductor memory device in accordance with the second exemplary embodiment of the present invention includes the first pipe gate 43A and the second pipe gate 46B.

In the second exemplary embodiment, the etching is stopped by at least the second pipe gate 46B during the slit etching process for forming the slit 53. Accordingly, the damage of the first pipe channel 51B and the first pipe gate 43A is prevented, thereby improving an etching margin.

In the second exemplary embodiment, as the second insulation pattern 45A is inserted under the second pipe gate 46B, the channel length between the lowermost memory cell and the first pipe channel transistor PCTr1 may increase. However, the increase in the channel distance is prevented by forming the second insulation pattern 45A thinly and forming the second pipe gate 46B and the second pipe channel 51C under the memory string. Thus, the cell on current is not lowered.

Figure 6:
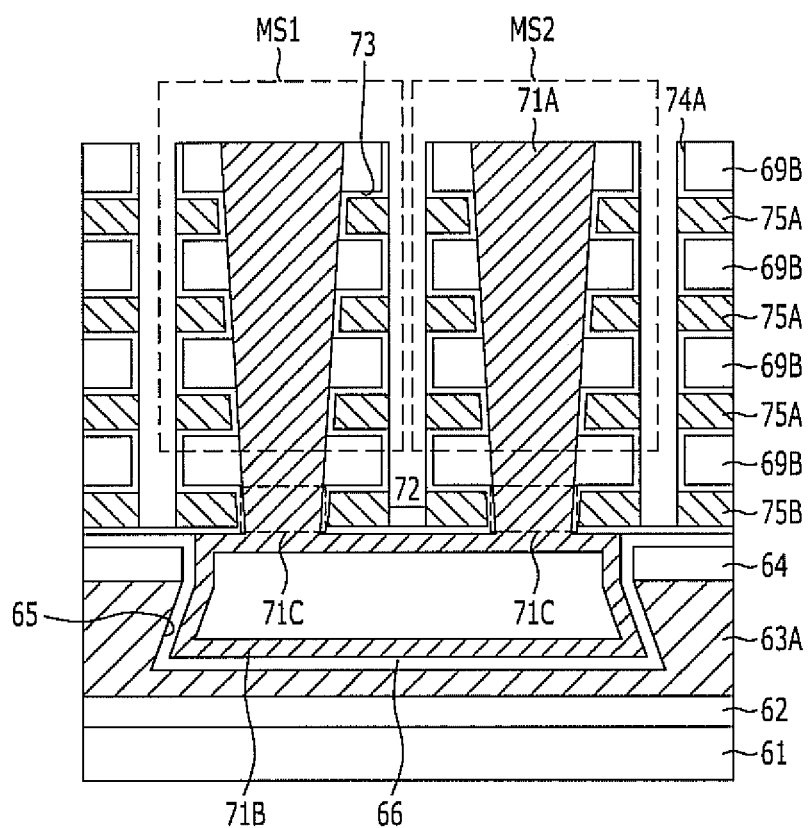
FIG. 6 is a cross-sectional view illustrating a structure of a nonvolatile memory device in accordance with a third exemplary embodiment of the present invention.

FIG. 6 is a cross-sectional view illustrating a structure of a nonvolatile memory device in accordance with a third exemplary embodiment of the present invention.

Referring to FIG. 6, the nonvolatile memory device includes a pair of cell channels 71A protruding from a substrate 61, a first pipe channel 71B coupling the bottoms of the pair of the cell channels 71A, a first pipe gate 63A in which the first pipe channel 71B is buried, a second pipe gate 75B surrounding the bottoms of the cell channels 71A, and control gate electrodes 75A surrounding the cell channels 71A. The control gate electrodes 75A between the cell channels 71A are separated from one another by a slit 72. The bottoms of the cell channels 71A surrounded by the second pipe gate 75B become a second pipe channel 71C.

Specifically, a first insulation layer 62 is formed between the substrate 61 and the first pipe gate 63A. The first insulation layer 62 may include an oxide layer, such as a silicon oxide layer. The substrate 61 may include a silicon substrate. The first pipe gate 63A may include a silicon layer, in particular, an N$^+$ polysilicon layer.

The cell channels 71A, the first pipe channel 71B, and the second pipe channels 71C are formed of the same material. For example, the cell channels 71A, the first pipe channel 71B, and the second pipe channels 71C may include a polysilicon layer, specifically, an undoped polysilicon layer. The cell channels 71A, the first pipe channel 71B, and the second pipe channels 71C collectively form a U-shaped structure.

The cell channels 71A have a columnar structure, the first pipe channel 71B fills the pipe channel hole 65 within the first pipe gate 63A. The cell channels 71A are surrounded by the control gate electrodes 75A and the second insulation patterns 69B, which are alternately stacked. The first pipe gate 63A has a pipe channel hole 65, and a pipe tunnel insulation layer 66 is formed on the surface of the pipe channel hole 65. The control gate electrodes 75A fill undercuts 73 formed between the second insulation patterns 69B. A charge storage or charge trapping layer 74A is formed between the control gate electrodes 75A and the cell channels 71A. The charge storage or charge trapping layer 74A includes a blocking layer, a charge trap layer, and a tunnel insulation layer. The lowermost control gate electrode becomes a second pipe gate 75B.

Two memory strings MS1 and MS2 are formed by the slit 72. A first pipe channel transistor PCTr1 is formed by the first pipe gate 63A and the first pipe channel 71B, and two second pipe channel transistors PCTr2 are formed by the second pipe gate 75B and the second pipe channels 71C. The two memory strings MS1 and MS2 are coupled to the first and second pipe channel transistors PCTr1 and PCTr2. The first pipe channel transistor PCTr1 and the second pipe channel transistors PCTr2 are coupled in series. Consequently, the two memory strings MS1 and MS2 are coupled in series through the first and second pipe channel transistors PCTr1 and PCTr2 to thereby constitute a single memory cell string. For example, where three memory cells are formed in each memory string, the single memory cell string includes six memory cells.

FIGS. 7A to 7K are cross-sectional views illustrating a method for fabricating a nonvolatile memory device in accordance with the third exemplary embodiment of the present invention. FIGS. 7A to 7K are cross-sectional views taken along the same direction as that of the line A-A' of FIG. 2C.

Figure 7A:
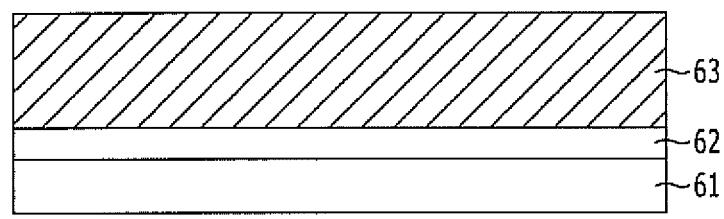
FIGS. 7A to 7K are cross-sectional views illustrating a method for fabricating a nonvolatile memory device in accordance with the third exemplary embodiment of the present invention.

Referring to FIG. 7A, a first conductive layer 63 is formed on a substrate 61. The substrate 61 may include a silicon substrate. A first insulation layer 62 is formed between the substrate 61 and the first conductive layer 63. The first insulation layer 62 may include a nitride layer, such as a silicon oxide layer. The first conductive layer 63 may include a silicon layer, in particular, an N$^+$ polysilicon layer. The first conductive layer 63 is used as a first pipe gate.

Figure 7B:
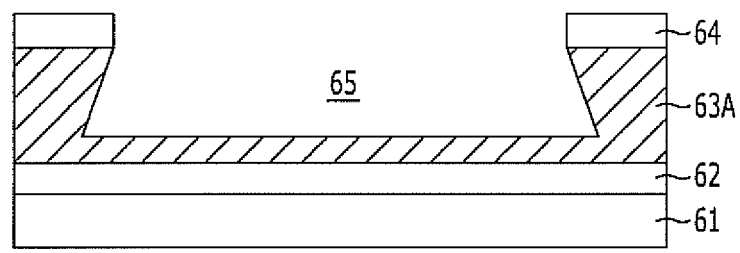

Referring to FIG. 7B, a polishing stop layer is formed on the first conductive layer 63. Then, the polishing stop layer and the first conductive layer 63 are etched to form a pipe channel hole 65. As a result, a first pipe gate 63A and a polishing stop pattern 64 are formed. In order to form the pipe channel hole 65, the first conductive layer 63 and polishing stop layer may be etched using an anisotropic etching process or an isotropic etching process. In this embodiment, the pipe channel hole 65 is formed using an isotropic etching process. The polishing stop pattern 64 may include an oxide layer, such as a silicon oxide layer.

Figure 7C:
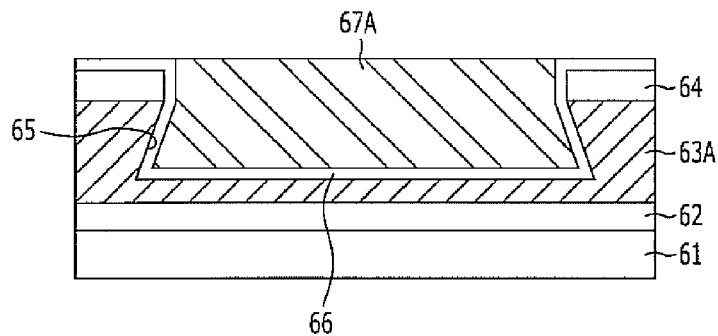

Referring to FIG. 7C, a pipe gate tunnel insulation layer 66 is formed on a resulting structure including the pipe channel hole 65. The pipe gate tunnel insulation layer 66 may include an oxide layer, such as a silicon oxide layer.

A first sacrificial layer 67 gap-filling the pipe channel hole 65 is formed on the pipe gate tunnel insulation layer 66. The first sacrificial layer 67 includes amorphous silicon or a silicon germanium compound. After forming the first sacrificial layer 67 over a resulting structure until it gap-fills the pipe channel hole 65, a planarization process, such as a chemical mechanical polishing (CMP) process, may be performed. In the planarization process, the planarizing is stopped at the pipe gate tunnel insulation layer 66. Performing the planarization process until the pipe gate tunnel insulation layer 66 is reached results in the formation of the first sacrificial pattern 67A.

Figure 7D:
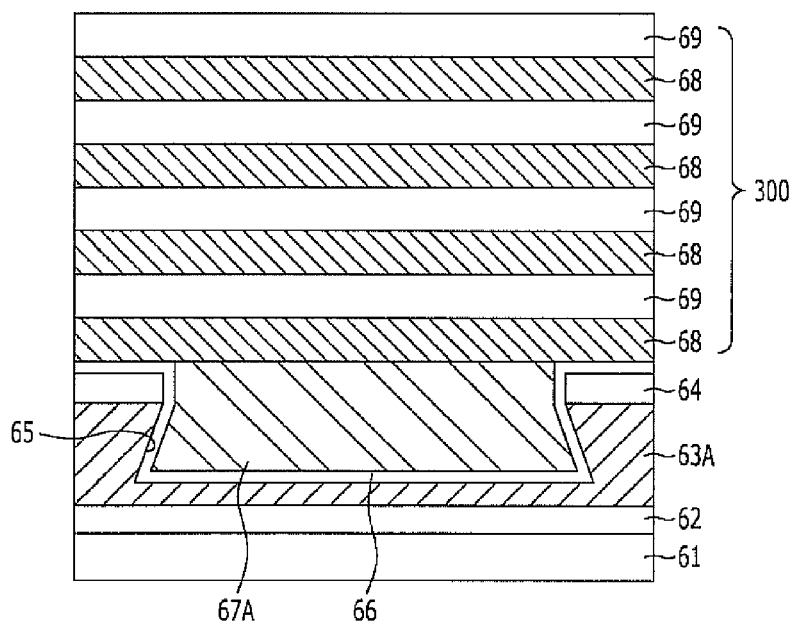

Referring to FIG. 7D, an insulation layer stack 300, in which second sacrificial layers 68 and second insulation layers 69 are alternately stacked, is formed on a resulting structure including the first sacrificial pattern 67A. The second sacrificial layers 68 include a nitride layer, such as a silicon nitride layer. The uppermost layer of the insulation layer stack 300 is the second insulation layer 69. Also, the second insulation layers 69 are used as an insulation layer between the control gate electrodes of the memory cells and include an oxide layer, such as a silicon oxide layer. The second sacrificial layers 68 and the second insulation layers 69 are repetitively formed according to the number of the memory cells desired to be stacked. Although any number of memory cells may be stacked, for convenience of explanation, the memory strings each include three stacked memory cells, and therefore, the memory cell string includes six memory cells.

Figure 7E:
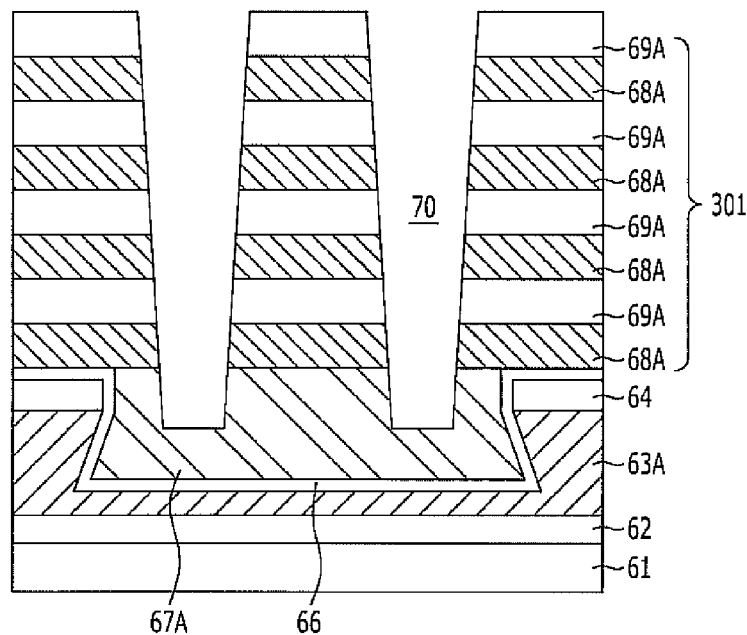

Referring to FIG. 7E, the insulation layer stack 300 is etched to form cell channel holes 70 exposing two separate portions of the surface of the first sacrificial pattern 67A. The cell channel holes 70 are formed to pass through the insulation layer stack 301. As a result of forming the cell channel holes 70, an insulation layer stack 301 has a structure in which second sacrificial patterns 68A and second insulation patterns 69A are alternately stacked. The cell channel holes 70 pass through the second sacrificial patterns 68A and the second insulation patterns 69A. Meanwhile, a lower end of the cell channel hole 70 may extend into the first sacrificial pattern 67A. However, since the first sacrificial pattern 67A serves as a passivation layer, the cell channel hole 70 does not pass through the first pipe gate 63A and stops at the first sacrificial pattern 67A.

Figure 7F:
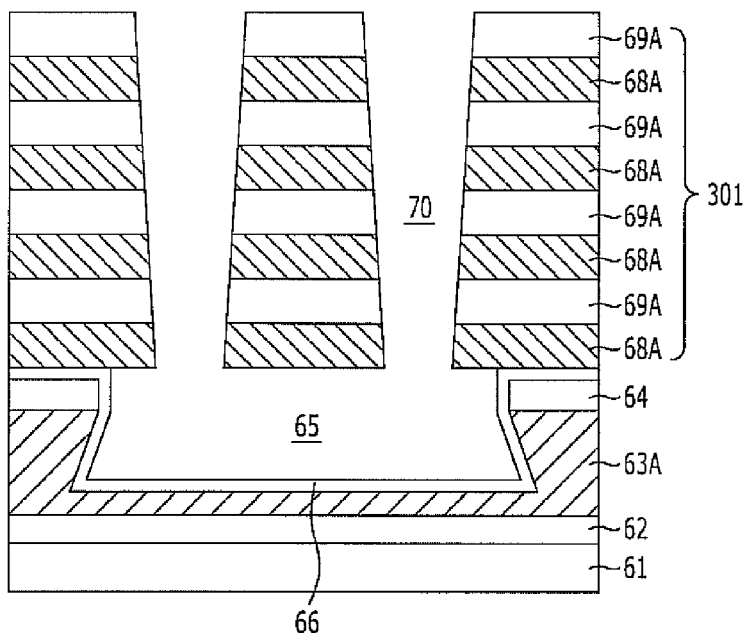

Referring to FIG. 7F, the first sacrificial pattern 67A is removed. Accordingly, the pipe channel hole 65 is again opened.

The first sacrificial pattern 67A may be removed by a wet process, in particular, a wet strip process. Accordingly, only the first sacrificial pattern 67A may be selectively removed without causing damage to the second insulation patterns 69A and the second sacrificial patterns 68A.

Figure 7G:
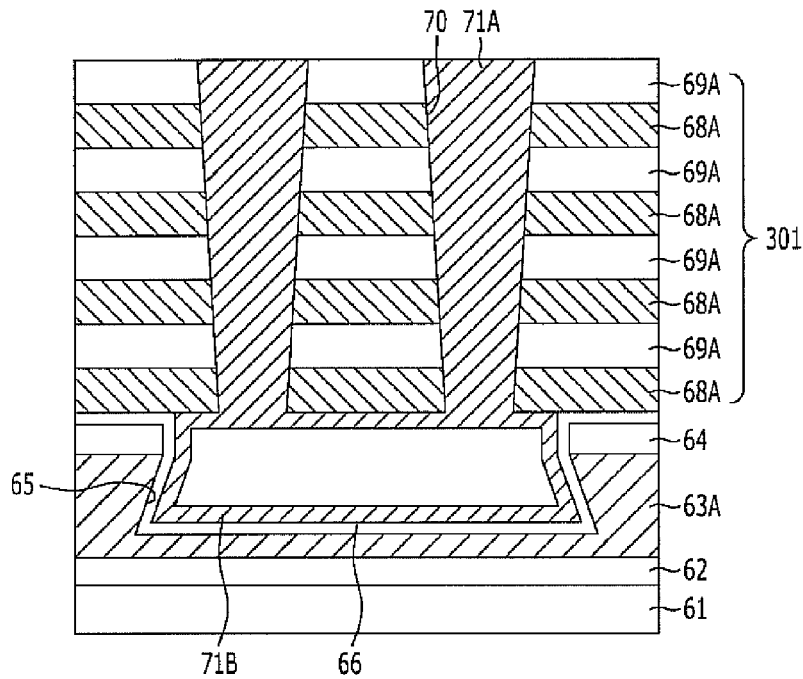

Referring to FIG. 7G, a second conductive layer is formed to fill the cell channel hole 70 and planarized using a CMP process or the like. The second conductive layer may include a polysilicon layer, specifically, an undoped polysilicon layer.

Due to such a planarization process, columnar cell channels 71A are formed within the cell channel holes 70, and a first pipe channel 71B is formed within the pipe channel hole 65. The first pipe channel 71B couples the bottoms of the adjacent cell channels 71A. Accordingly, the cell channels 71A and the first pipe channel 71B collectively form a U-shaped structure. Because the first pipe channel 71B closes the opening at the bottom of the cell channel holes 70 before the pipe channel hole 65 is filled, the pipe channel hole 65 has a hollow region inside. That is, when forming the second conductive layer used as the cell channel 71A and the first pipe channel 71B, the second conductive layer is not formed within the pipe channel hole 65 once the bottom of the cell channel hole 70 is clogged. Thus, the hollow region may be formed inside the pipe channel hole 65.

Figure 7H:
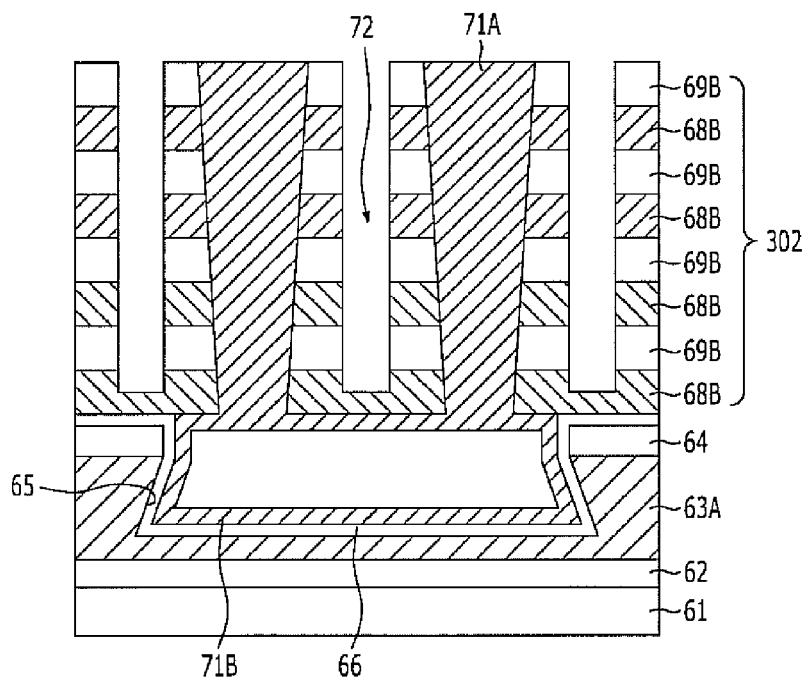

Referring to FIG. 7H, a slit etching process is performed to form a slit 72. The slit 72 is formed in the insulation layer stack 301 to form the insulation layer stack 302 having second sacrificial patterns 68B and second insulation patterns 69B, which are alternately stacked. Further, the bottom of the slit 72 extends to the lowermost second sacrificial pattern 68B.

During the slit etching process for forming the slit 72, the etching may be stopped at the second sacrificial pattern 68B formed of nitride. Consequently, damage to the first pipe channel 71B and the first pipe gate 63A may be prevented.

Figure 7I:
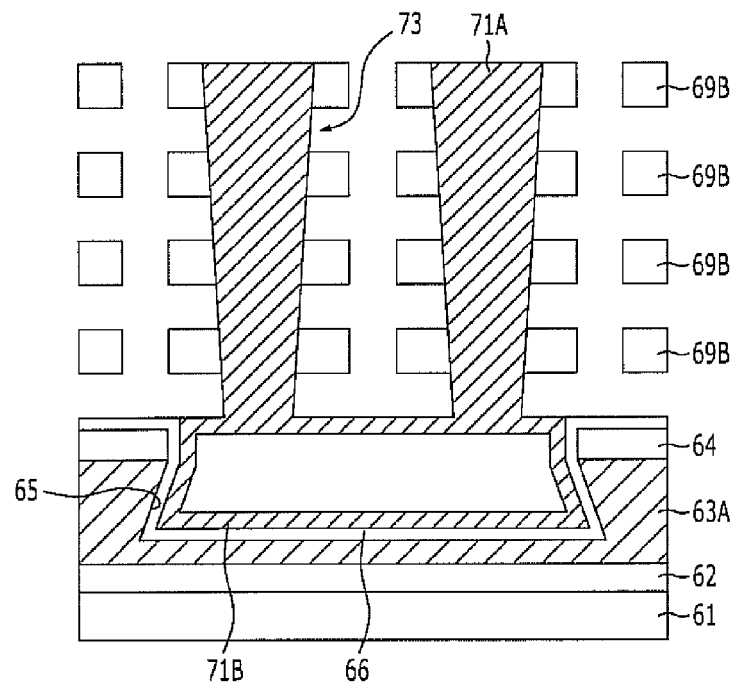

Referring to FIG. 7I, the second sacrificial patterns 68B are selectively removed. Accordingly, undercuts 73 are formed between the second insulation patterns 69B where the second sacrificial patterns 68B are removed.

Figure 7J:
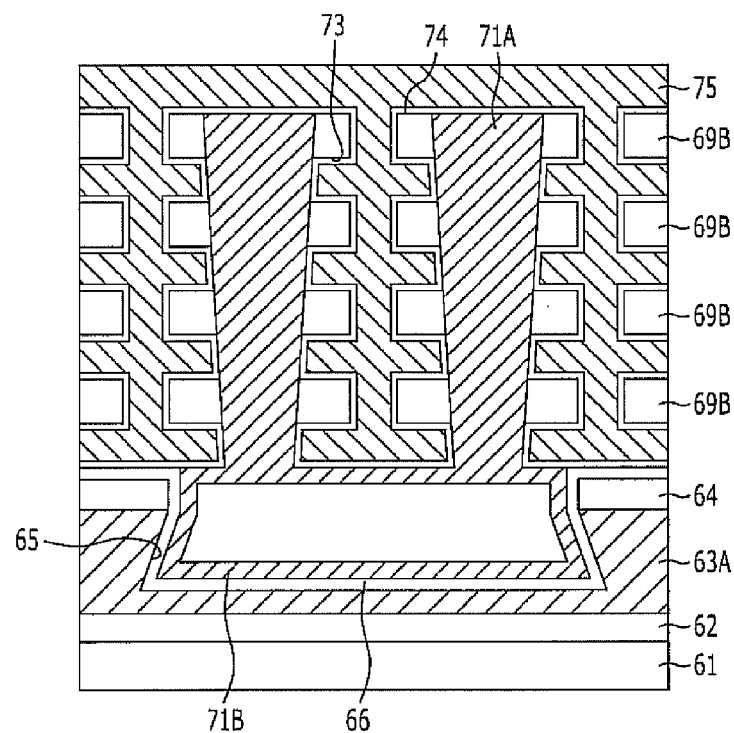

Referring to FIG. 7J, a charge storage or charge trapping layer 74 is formed on a resulting structure including the undercuts 73. The charge storage or charge trapping layer 74 may include a blocking layer, a charge trap layer, and a tunnel insulation layer. That is, the charge storage or charge trapping layer 74 is formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer. Therefore, the charge storage or charge trapping layer 74 may have an oxide-nitride-oxide (ONO) structure.

A third conductive layer 75 is formed on the charge storage or charge trapping layer 74 to fill the undercuts 73. The third conductive layer 75 may include a silicon layer. In particular, the third conductive layer 75 includes a polysilicon layer, specifically, an undoped polysilicon layer. The third conductive layer 75 is used as a the control gate electrodes of the memory cell.

Figure 7K:
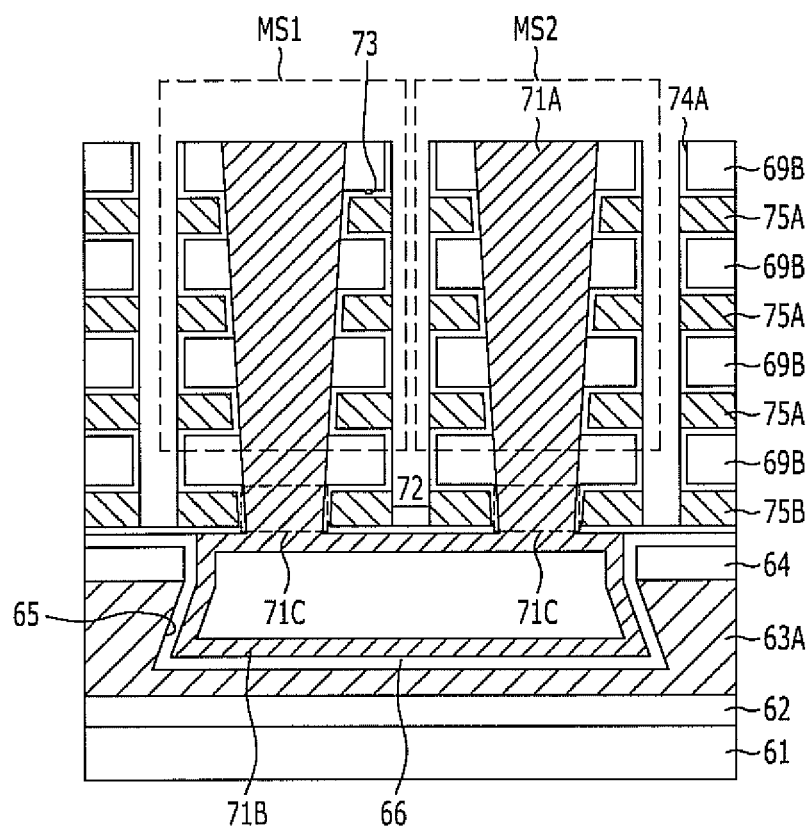

Referring to FIG. 7K, control gate electrodes 75A are formed by selectively separating the third conductive layer 75. The control gate electrodes 75A surround the cell channels 71A while filling the undercuts 73. As a result, the cell channels 71A pass through the control gate electrodes 75A, and a charge storage or charge trapping layer 74A is formed between the cell channels 71A and the control gate electrodes 75A. In order to form the control gate electrodes 75A, an etch-back process is used. The use of the etch-back process makes it easy to selectively separate the third conductive layer 75 to form the control gate electrodes 75A. When forming the control gate electrodes 75A, the control gate electrode buried in the lowermost undercut 73 becomes the second pipe gate 75B.

As such, due to the formation of the control gate electrodes 75A, two memory strings MS1 and MS2, in which second insulation patterns 69B and control gate electrodes 75A are alternately stacked, are formed.

A second pipe gate 75B is formed under the memory strings MS1 and MS2. The charge storage or charge trapping layer 74A, the pipe gate tunnel insulation layer 66, and the polishing stop pattern 64 serve as an insulation layer between the second pipe gate 75B and the first pipe gate 63A. The bottoms of the adjacent cell channels 71A are coupled together through the first pipe channel 71B. The first pipe channel 71B is buried within the pipe channel hole 65. The bottoms of the cell channels 71A, which are surrounded by the second pipe gate 75B, are referred to as the second pipe channels 71C. The second pipe gate 75B and the second pipe channels 71C form two second pipe channel transistors PCTr2, and the first pipe gate 63A and the first pipe channel 71B form a first pipe channel transistor PCTr1.

The semiconductor memory device in accordance with the third exemplary embodiment of the present invention includes the first pipe gate 63A and the second pipe gate 75B.

Figure 8:
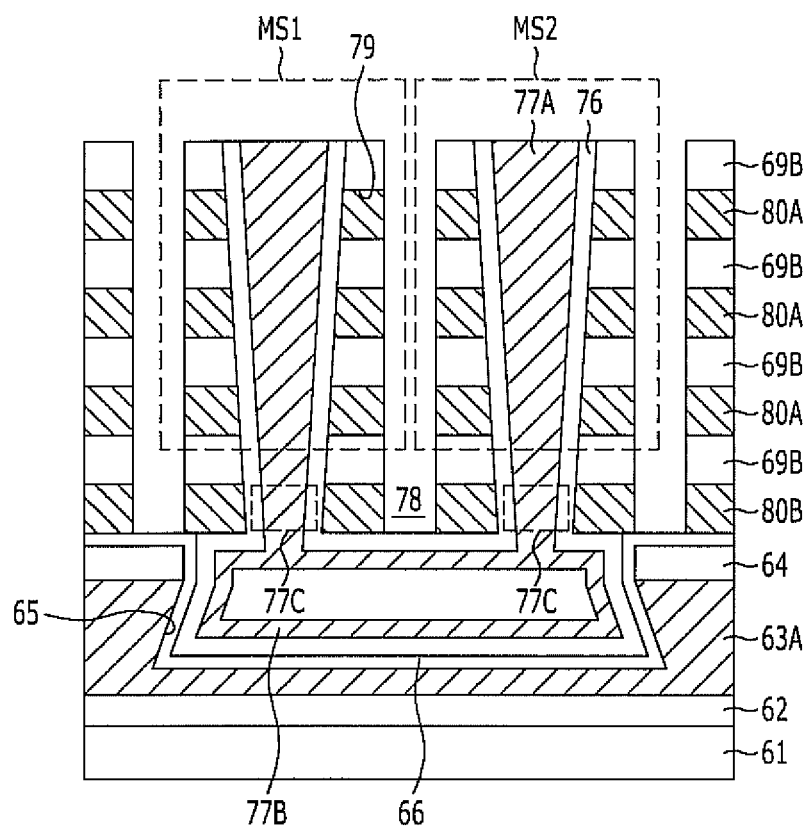
FIG. 8 is a cross-sectional view illustrating a structure of a nonvolatile memory device in accordance with a fourth exemplary embodiment of the present invention.

FIG. 8 is a cross-sectional view illustrating a structure of a nonvolatile memory device in accordance with a fourth exemplary embodiment of the present invention.

Referring to FIG. 8, the nonvolatile memory device includes a pair of cell channels 77A protruding from a substrate 61, a first pipe channel 77B coupling the bottoms of the pair of the cell channels 77A, a first pipe gate 63A in which the first pipe channel 77B is buried, a second pipe gate 80B surrounding the bottoms of the cell channels 77A, and control gate electrodes 80A surrounding the cell channels 77A. The control gate electrodes 80A between the cell channels 77A are separated from one another by a slit 78. Due to the second pipe gate 80B, the bottoms of the cell channels 77A become second pipe channels 77C.

Specifically, a first insulation layer 62 is formed between the substrate 61 and the first pipe gate 63A. The first insulation layer 62 may include an oxide layer, such as a silicon oxide layer. The substrate 61 may include a silicon substrate. The first pipe gate 63A may include a silicon layer, in particular, an N+ polysilicon layer.

The cell channels 77A, the first pipe channel 77B, and the second pipe channels 77C are formed of the same material. For example, the cell channels 77A, the first pipe channel 77B, and the second pipe channels 77C may include a polysilicon layer, specifically, an undoped polysilicon layer. The cell channels 77A, the first pipe channel 77B, and the second pipe channels 77C collectively form a U-shaped structure.

The cell channels 77A have a columnar structure, and the first pipe channel 77B fills the first pipe gate 63A. The cell channels 77A are surrounded by the control gate electrodes 80A and second insulation patterns 69B, which are alternately stacked. The first pipe gate 63A has a pipe channel hole 65, and a pipe tunnel insulation layer 66 is formed on the surface of the pipe channel hole 65. The control gate electrodes 80A fill undercuts 79 formed between the second insulation patterns 69B. A charge storage or charge trapping layer 76 is formed between the control gate electrodes 80A and the cell channels 77A. The charge storage or charge trapping layer 76 is formed to surround the cell channel 77A. The charge storage or charge trapping layer 76 includes a blocking layer, a charge trap layer, and a tunnel insulation layer. The lowermost control gate electrode becomes the second pipe gate 80B.

Two memory strings MS1 and MS2 are formed by the slit 78. A first pipe channel transistor PCTr1 is formed by the first pipe gate 63A and the first pipe channel 77B, and two second pipe channel transistors PCTr2 are formed by the second pipe gate 80B and the second pipe channels 77C. The two memory strings MS1 and MS2 are coupled to the first and second pipe channel transistors PCTr1 and PCTr2. The first pipe channel transistor PCTr1 and the second pipe channel transistor PCTr2 are coupled in series. Consequently, the two memory strings MS1 and MS2 are coupled in series through the first and second pipe channel transistors PCTr1 and PCTr2 to thereby constitute a single memory cell string. For example, where three memory cells are formed in each memory string, the single memory cell string includes six memory cells.

FIGS. 9A to 9F are cross-sectional views illustrating a method for fabricating a nonvolatile memory device in accordance with a fourth exemplary embodiment of the present invention. In the fourth exemplary embodiment, the processes until the process of again opening the pipe channel hole are performed in the same manner as those of the third embodiment as illustrated in FIGS. 7A to 7F, and therefore, a description of such processes is omitted for the fourth exemplary embodiment.

Figure 9A:
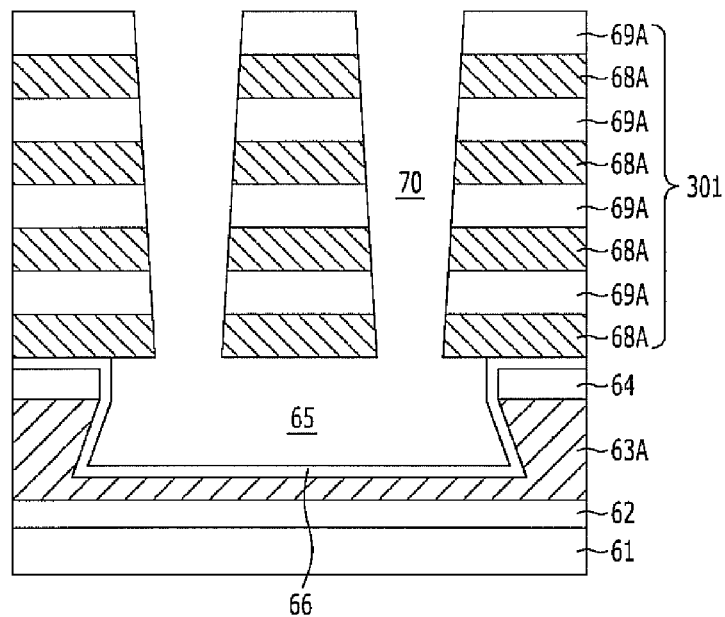
FIGS. 9A to 9F are cross-sectional views illustrating a method for fabricating a nonvolatile memory device in accordance with the fourth exemplary embodiment of the present invention.

Referring to FIG. 9A, the pipe channel hole 65 coupling the pair of the pipe channel holes 70 is again opened.

Figure 9B:
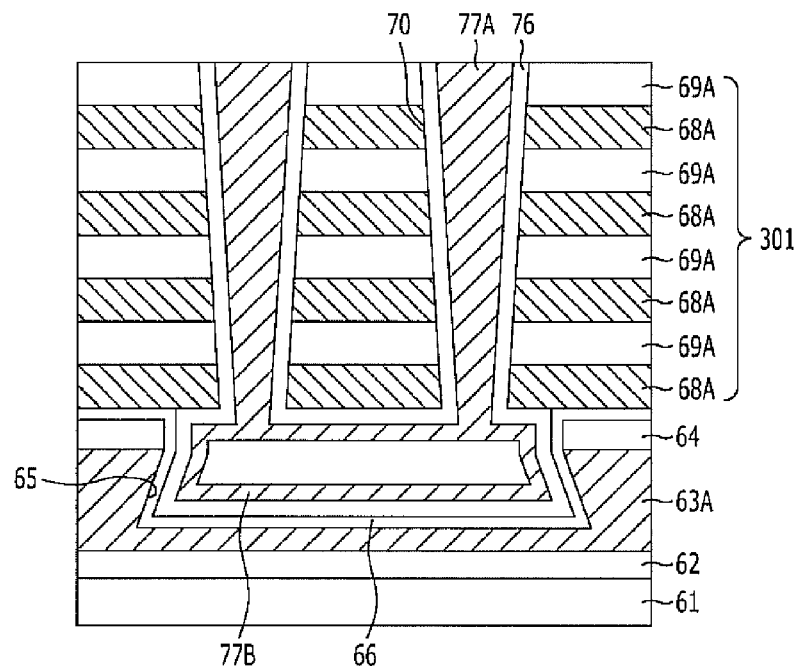

Referring to FIG. 9B, a charge storage or charge trapping layer 76 is formed on an insulation layer stack 301, including the cell channel holes 70 and the pipe channel hole 65. The charge storage or charge trapping layer 76 may include a blocking layer, a charge trap layer, and a tunnel insulation layer. That is, the charge storage or charge trapping layer 76 is formed by sequentially stacking the blocking layer, the charge trap layer, and the tunnel insulation layer. The blocking layer prevents charges from passing through the charge to trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer. Thus, the charge storage or charge trapping layer 76 may have an ONO structure.

A second conductive layer is formed on the charge storage or charge trapping layer 76 to fill the cell channel holes 70, and planarized using a CMP process or the like. The second conductive layer may include a polysilicon layer, specifically, an undoped polysilicon layer.

Due to such a planarization process, columnar cell channels 77A are formed within the cell channel holes 70, and a first pipe channel 77B is formed within the pipe channel hole 65. The first pipe channel 77B couples the pair of the adjacent cell channels 77A. Accordingly, the cell channels 77A and the first pipe channel 77B collectively form a U-shaped structure. Due to the first pipe channel 77B, a hollow region may be formed inside of the pipe channel hole 65.

Figure 9C:
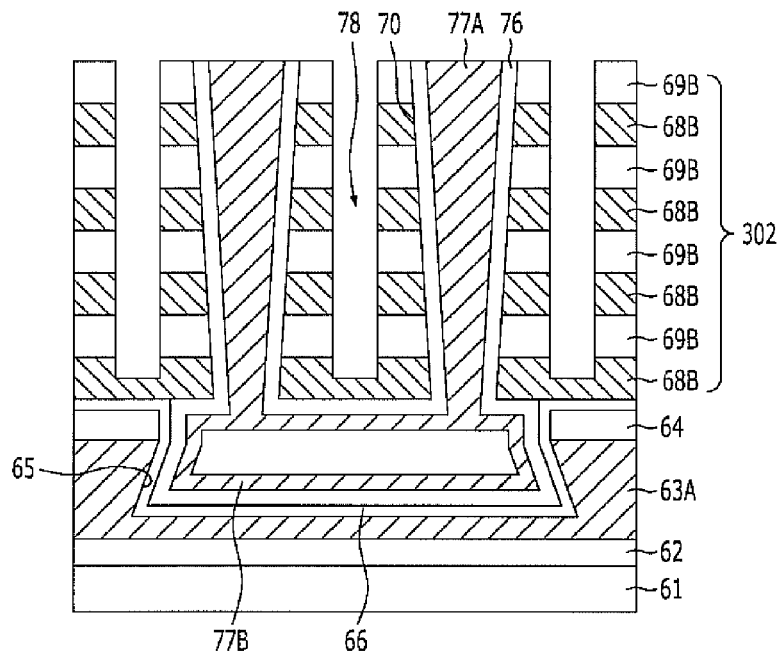

Referring to FIG. 9C, a slit etching process is performed to form a slit 78. The slit 78 is formed in the insulation layer stack 301 to form the insulation layer stack 302 having second sacrificial patterns 68B and second insulation patterns 69B, which are alternately stacked. Further, the bottom of the slit 78 extends to the lowermost second sacrificial pattern 68B.

During the slit etching process for forming the slit 78, the etching may be stopped at the second sacrificial pattern 68B formed of nitride. Consequently, the damage of the first pipe channel 77B and the first pipe gate 63A is prevented.

Figure 9D:
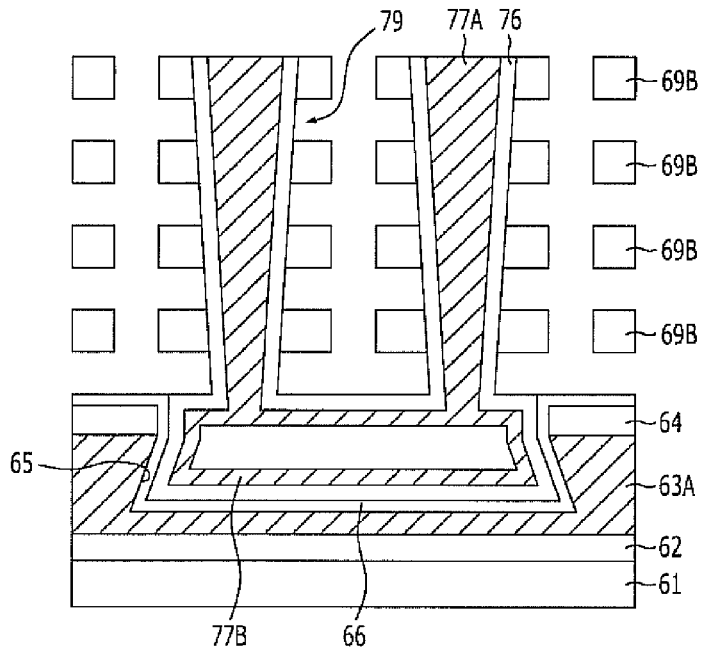

Referring to FIG. 9D, the second sacrificial pattern 68B is selectively removed. Accordingly, undercuts 79 are formed between the second insulation patterns 69B where the second sacrificial patterns 68B are removed.

Figure 9E:
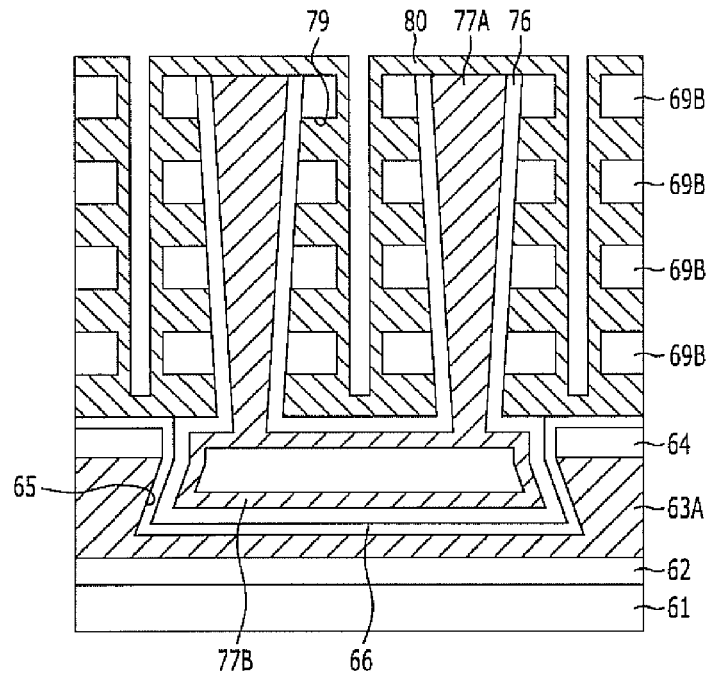

Referring to FIG. 9E, a third conductive layer 80 is formed to fill the undercuts 79. The third conductive layer 80 may include a silicon layer. In particular, the third conductive layer 80 includes a polysilicon layer, specifically, an undoped polysilicon layer. The third conductive layer 80 is used as a control gate electrode of the memory cell.

Figure 9F:
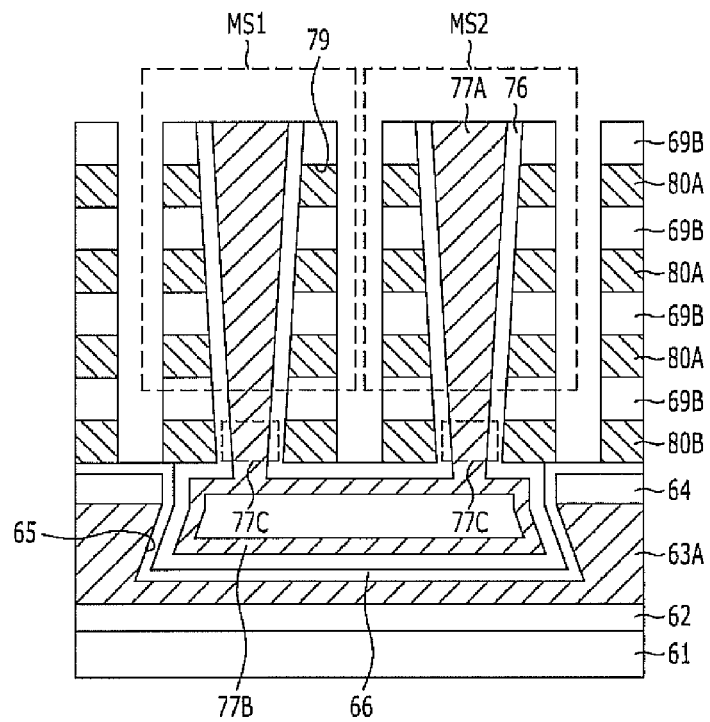

Referring to FIG. 9F, control gate electrodes 80A are formed by selectively separating the third conductive layer 80. The control gate electrodes 80A surround the cell channels 77A while filling the undercuts 79. As a result, the cell channels 77A pass through the control gate electrodes 80A, and a charge storage or charge trapping layer 76 is formed between the cell channels 77A and the control gate electrodes 80A. In order to form the control gate electrodes 80A, an etch-back process is used. The use of the etch-back process makes it easy to selectively separate the third conductive layer 80 to form the control gate electrodes 80A. When forming the control gate electrodes 80A, the control gate electrode buried in the lowermost undercut 79 becomes the second pipe gate 80B.

As such, due to the formation of the control gate electrodes 80A, two memory strings MS1 and MS2, in which second insulation patterns 69B and control gate electrodes 80A are alternately stacked, are formed.

A second pipe gate 80B is formed under the memory strings MS1 and MS2. The pipe gate tunnel insulation layer 66 and the polishing stop pattern 64 serve as an insulation layer between the second pipe gate 80B and the first pipe gate 63A. The bottoms the adjacent cell channels 77A are coupled together through the first pipe channel 77B. The first pipe channel 77B is buried within the pipe channel hole 65. The bottoms of the cell channels 77A, which are surrounded by the second pipe gate 80B, are referred to as the second pipe channels 77C. The second pipe gate BOB and the second pipe channels 77C form two second pipe channel transistors PCTr2, and the first pipe gate 63A and the first pipe channel 77B form a first pipe channel transistor PCTr1.

The semiconductor memory device in accordance with the fourth exemplary embodiment of the present invention includes the first pipe gate 63A and the second pipe gate 80B.

Figure 10:
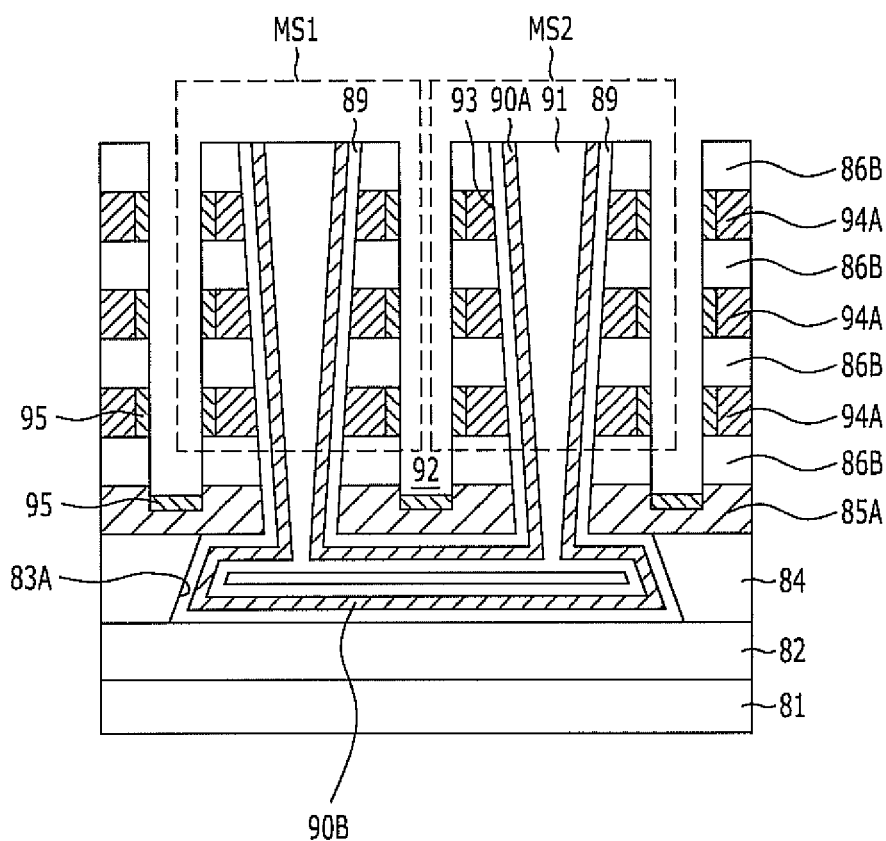
FIG. 10 is a cross-sectional view illustrating a structure of a nonvolatile memory device in accordance with a fifth exemplary embodiment of the present invention.

FIG. 10 is a cross-sectional view illustrating a structure of a nonvolatile memory device in accordance with a fifth exemplary embodiment of the present invention.

Referring to FIG. 10, the nonvolatile memory device includes a pair of cell channels 90A protruding from a substrate 81, a pipe channel 90B coupling the bottoms of the pair of the cell channels 90A, a pipe gate 85A surrounding the bottoms of the cell channels 90A, first and second insulation layers 82 and 84 in which the pipe channel 90B is buried, and control gate electrodes 94A surrounding the cell channels 90A. The control gate electrodes 94A between the cell channels 90A are separated from one another by a slit 92. Due to the pipe gate 85A, the bottoms of the cell channels 90A become a pipe channel 90B.

Specifically, the substrate 81 may include a silicon substrate. The first insulation layer 82 and the second insulation later 84 may include an oxide layer, such as a silicon oxide layer. The first insulation layer 82 and the second insulation layer 84 have a pipe channel hole 83A. Hereinafter, the first insulation layer 82 and the second insulation layer 84 together may be referred to as a pipe insulation layer.

The pipe gate 85A formed on the second insulation layer 84 may include a silicon layer, in particular, an N$^+$ polysilicon layer.

The cell channels 90A and the pipe channel 90B are formed of the same material. For example, the cell channels 90A and the pipe channel 90B may include a polysilicon layer, specifically, an undoped polysilicon layer. The cell channels 90A and the pipe channel 90B collectively form a U-shaped structure.

The cell channels 90A are surrounded by the control gate electrodes 94A and the third insulation patterns 86B, which are alternately stacked. Sidewalls of the cell channel 90A are surrounded by a charge storage or charge trapping layer 89, and the inside of the cell channels 90A is filled with a fourth insulation pattern 91. The charge storage or charge trapping layer 89 may include a blocking layer, a charge trap layer, and a tunnel insulation layer. The fourth insulation pattern 91 may include an oxide layer, such as a silicon oxide layer.

The pipe gate 85A is formed under the lowermost control gate electrode 94A, and the pipe gate 85A serves as an etch stop layer during the formation of the slit 92. A silicide layer 95 is formed on portions of the surface of the pipe gate 85A that are exposed by the slit 92.

Two memory strings MS1 and MS2 are formed by the slit 92. A pipe channel transistor PCTr is formed by the pipe gate 85A and the pipe channel 90B. The two memory strings MS1 and MS2 are coupled to the pipe channel transistor PCTr. Consequently, the two memory strings MS1 and MS2 are coupled in series through the pipe channel transistor PCTr to thereby constitute a single memory cell string. For example, where three memory cells are formed in each memory string, the single memory cell string includes six memory cells.

In the fifth exemplary embodiment, the pipe gate 85A is formed under the lowermost control gate electrode 94A, and the single pipe channel transistor having the pipe gate 85A is provided. Since the pipe gate 85A serves as an etch stop layer during the formation of the slit 92, damage to the pipe channel 90B buried in the pipe channel hole 83A may be prevented.

FIGS. 11A to 11I are cross-sectional views illustrating a method for fabricating a nonvolatile memory device in accordance with the fifth exemplary embodiment of the present invention.

Figure 11A:
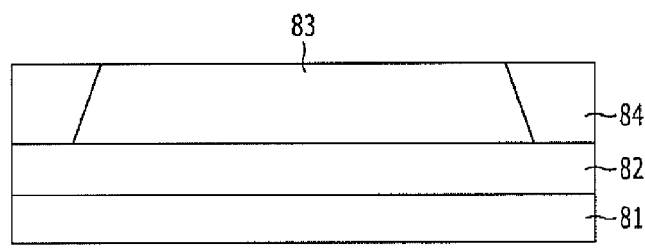
FIGS. 11A to 11I are cross-sectional views illustrating a method for fabricating a nonvolatile memory device in accordance with a fifth exemplary embodiment of the present invention.

Referring to FIG. 11A, a first insulation layer 82 is formed on a substrate 81. The substrate 81 may include a silicon substrate. The first insulation layer 82 may include an oxide layer.

A first sacrificial layer 83 is formed on the first insulation layer 82. The first sacrificial layer 83 may be formed by a photolithography process and an etching process. The first sacrificial layer 83 may include amorphous silicon or silicon germanium compound.

A second insulation layer 84 is formed on the first sacrificial layer 83 and planarized until the surface of the first sacrificial layer 83 is exposed. The planarization process may include a CMP process.

Figure 11B:
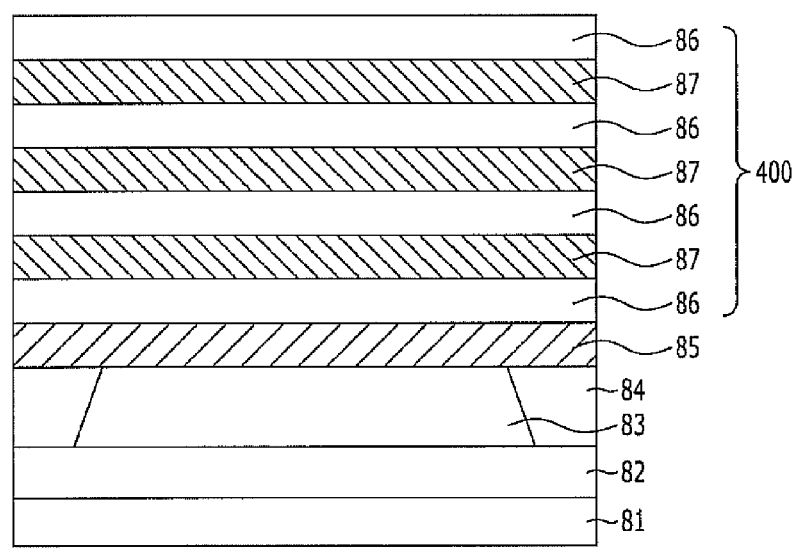

Referring to FIG. 11B, a first conductive layer 85 is formed on a resulting structure, including the first sacrificial layer 83 and the second insulation layer 84. The first conductive layer 85 may include a silicon layer, in particular, an N$^+$ polysilicon layer. The first conductive layer 85 is used as a pipe gate.

An insulation layer stack 400, in which third insulation layers 86 and second sacrificial layers 87 are alternately stacked, is formed on the first conductive layer 85. The second sacrificial layers 87 may include a nitride layer, such as a silicon nitride layer. The uppermost layer of the insulation layer stack 400 is the third insulation layer 86. Also, the third insulation layers 86 are used as an insulation layer between the control gate electrodes of the memory cells and may include an oxide layer, such as a silicon oxide layer. The second sacrificial layers 87 and the third insulation layers 86 are repetitively formed according to the number of the memory cells desired to be stacked. Although any number of memory cells may be stacked, for convenience of explanation, with regards to the fifth exemplary embodiment of the present invention, the memory strings each include three stacked memory cells, and therefore, the memory cell string includes six memory cells.

Figure 11C:
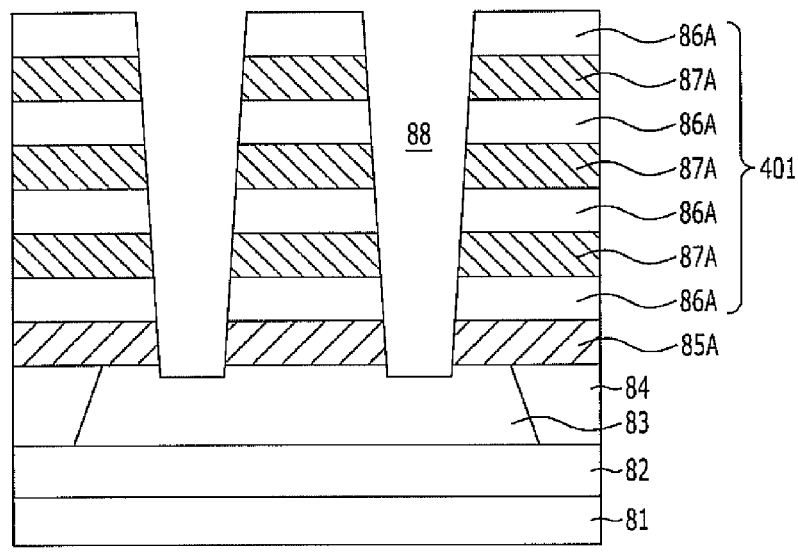

Referring to FIG. 11C, the insulation layer stack 400 and the first conductive layer 85 are etched to form cell channel holes 88 exposing two separate portions of the surface of the first sacrificial layer 83. The cell channel holes 88 are formed to pass through the insulation layer stack 400 and the first conductive layer 85. As a result of forming the cell channel holes 88, an insulation layer stack 401 having a structure in which third insulation patterns 86A and second sacrificial patterns 87A are alternately stacked and a pipe gate 85A are formed. The cell channel holes 88 pass through the second sacrificial patterns 87A and the third insulation patterns 86A.

Figure 11D:
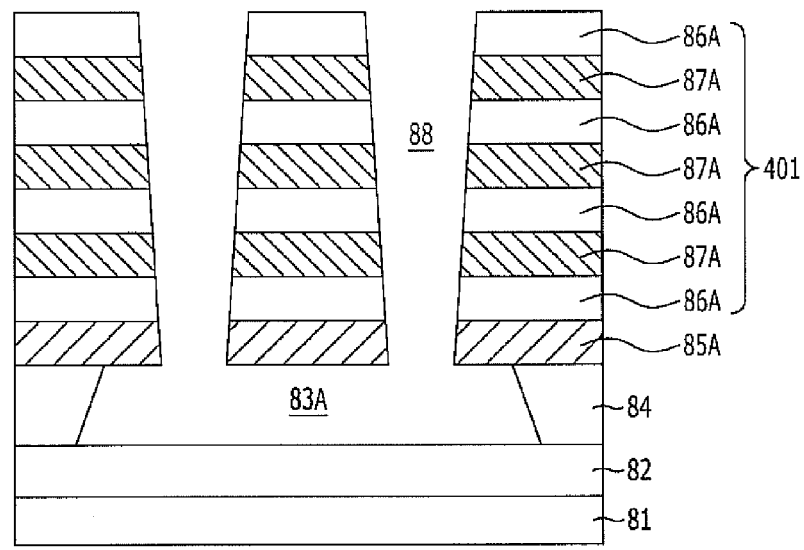

Referring to FIG. 11D, the first sacrificial layer 83 is removed. Accordingly, the pipe channel hole 83A is again opened.

The first sacrificial layer 83 may be removed by a wet process, in particular, a wet strip process. Accordingly, only the first sacrificial layer 83 may be selectively removed without causing damage to the third insulation patterns 86A and the second sacrificial patterns 87A.

Figure 11E:
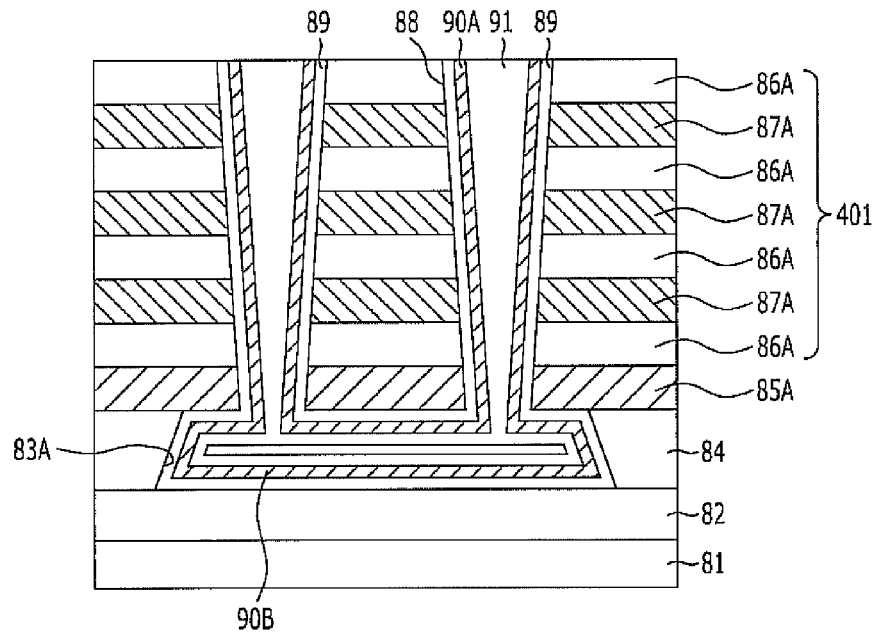

Referring to FIG. 11E, a charge storage or charge trapping layer 89 is formed over the insulation layer stack 401, including the cell channel holes 88 and the pipe channel hole 83A. The charge storage or charge trapping layer 89 may include a blocking layer, a charge trap layer, and a tunnel insulation layer. That is, the charge storage or charge trapping layer 89 may be formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer. Therefore, the charge storage or charge trapping layer 89 may have an oxide-nitride-oxide (ONO) structure.

A second conductive layer and a fourth insulation layer 91 are formed on the charge storage or charge trapping layer 89 to fill the cell channel holes 88 and are planarized using a CMP process or the like. The second conductive layer may include a polysilicon layer, specifically, an undoped polysilicon layer.

Due to such a planarization process, the second conductive layer becomes columnar cell channels 90A, which are formed within the cell channel holes 88, and a pipe channel 90B, which is formed within the pipe channel hole 83A. That is, the cell channels 90A and the pipe channel 90B are formed from the second conductive layer. The pipe channel 90B couples the pair of the adjacent cell channels 90A. Accordingly, the cell channels 90A and the pipe channel 90B collectively form a U-shaped structure. Due to the pipe channel 90B, a hollow region is formed inside the pipe channel hole 83A. Further, in this exemplary embodiment, the bottom of the cell channel 90A, that is, the portion surrounded by the pipe gate 85A, is considered part of the pipe channel 90B.

Figure 11F:
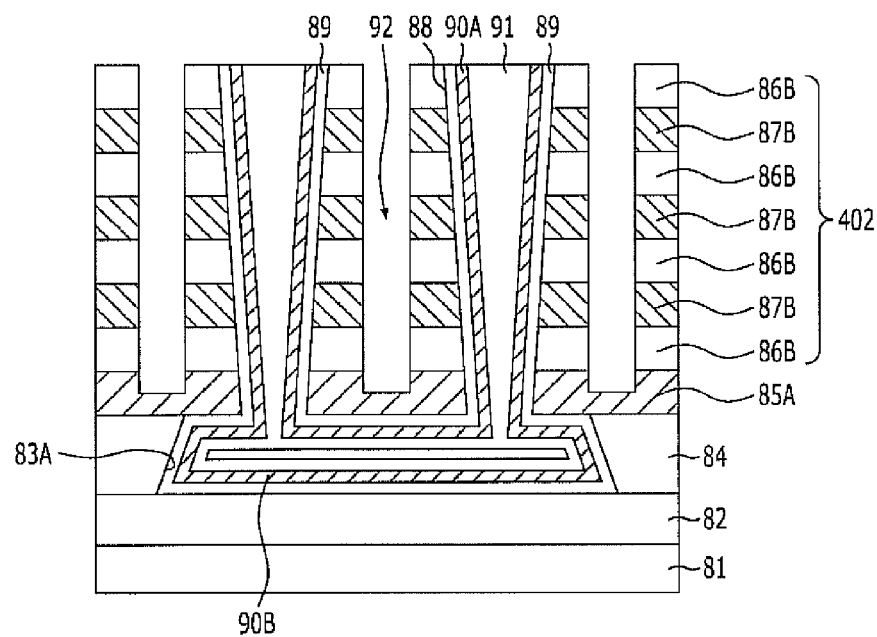

Referring to FIG. 11F, a slit etching process is performed to form a slit 92. The slit 92 is formed in the insulation layer stack 402, and the bottom of the slit 92 extends to the pipe gate 85A. The insulation layer stack 402 has a structure in which the third insulation patterns 86B and the sacrificial patterns 87B are alternately stacked.

During the slit etching process for forming the slit 92, the etching may be stopped at the pipe gate 85A. Consequently, damage to the pipe channel 90B is prevented.

Figure 11G:
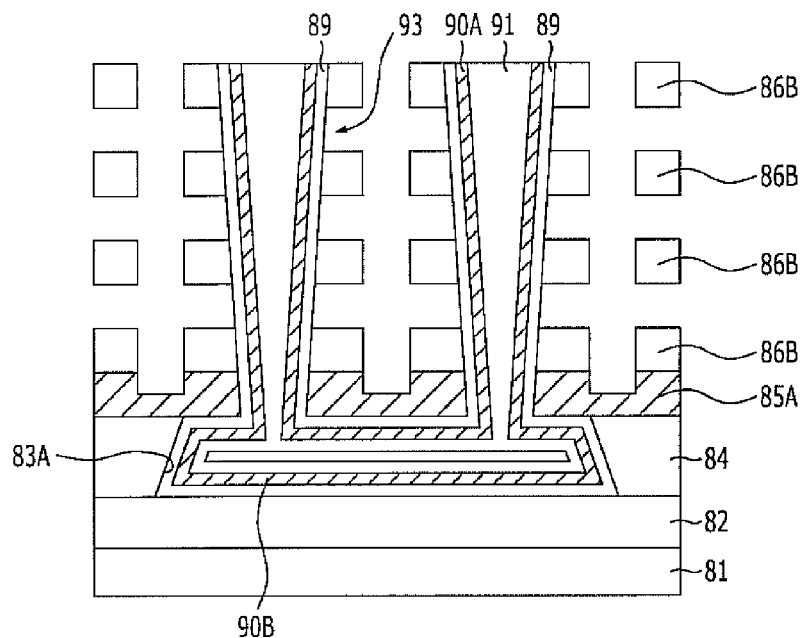

Referring to FIG. 11G, the second sacrificial patterns 87B are selectively removed. Accordingly, undercuts 93 are formed between the third insulation patterns 86B where the second sacrificial patterns 87B are removed.

Figure 11H:
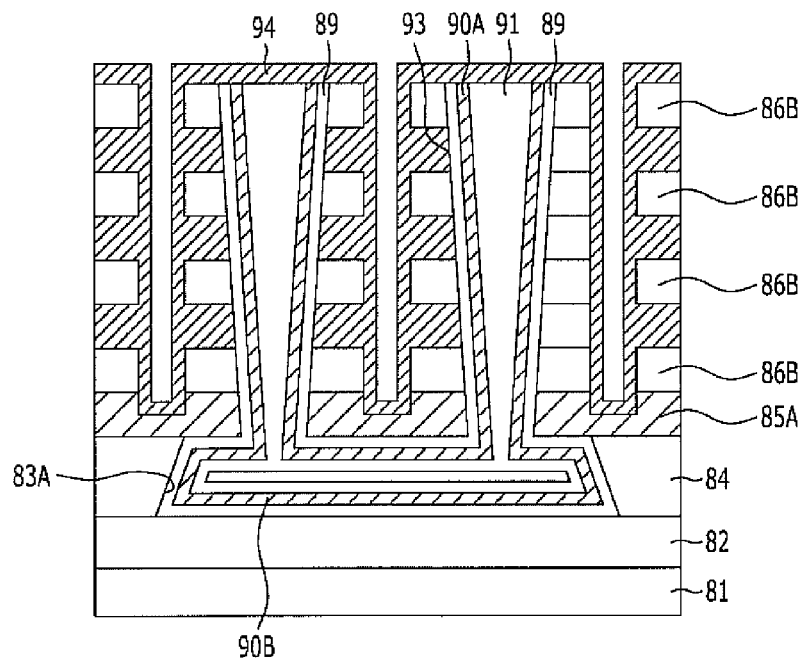

Referring to FIG. 11H, a third conductive layer 94 is formed to fill the undercuts 93. The third conductive layer 94 may include a polysilicon layer or a metal layer. The metal layer may include titanium. The third conductive layer 94 is used as the control gate electrode of the memory cell.

Figure 11I:
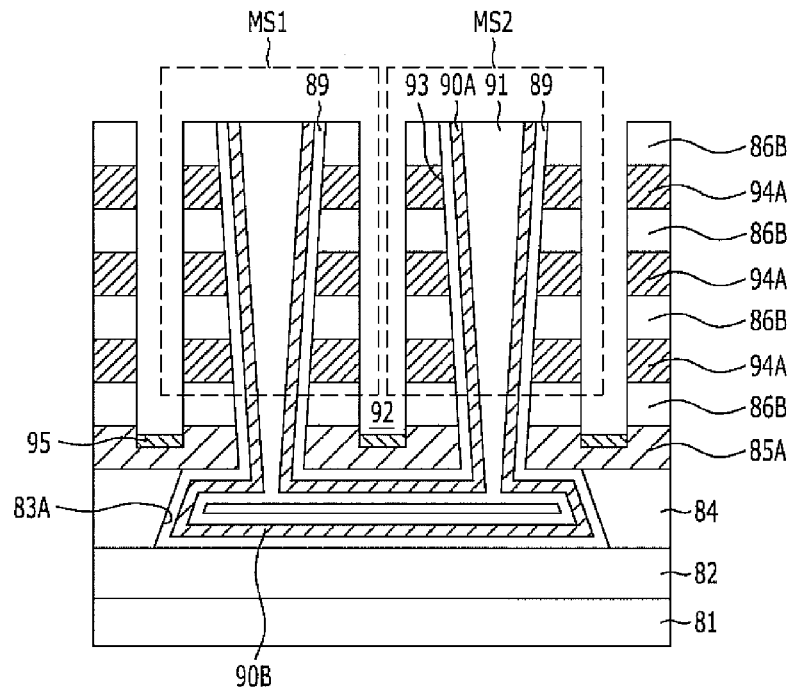

Referring to FIG. 11I, when the third conductive layer 94 includes a metal layer, a silicide process is performed to form a silicide 95 on the surface of the pipe gate 85A. The silicide 95 may include titanium silicide.

Control gate electrodes 94A are formed by selectively separating the third conductive layer 94. The control gate electrodes 94A surround the cell channel 90A while filling the undercuts 93. As a result, the cell channels 90A pass through the control gate electrodes 94A, and a charge storage or charge trapping layer 89 is formed between the cell channels 90A and the control gate electrodes 94A. In order to form the control gate electrodes 94A, an etch-back process is used. The use of the etch-back process makes it easy to separate the control gate electrodes 94A.

As such, due to the formation of the control gate electrodes 94A, two memory strings MS1 and MS2, in which third insulation patterns 86B and control gate electrodes 94A are alternately stacked, are formed.

A pipe gate 85A is formed under the memory strings MS1 and MS2, and a second insulation layer 84 is formed under the pipe gate 85A. The bottoms of the pair of the adjacent cell channels 90A are coupled together through the pipe channel 90B. The pipe channel 90B is buried within the pipe channel hole 83A. The bottom of the cell channel 90A surrounded by the pipe gate 85A is considered to be part of the pipe channel 90B. The pipe gate 85A and the pipe channel 90B form a pipe channel transistor.

Figure 11J:
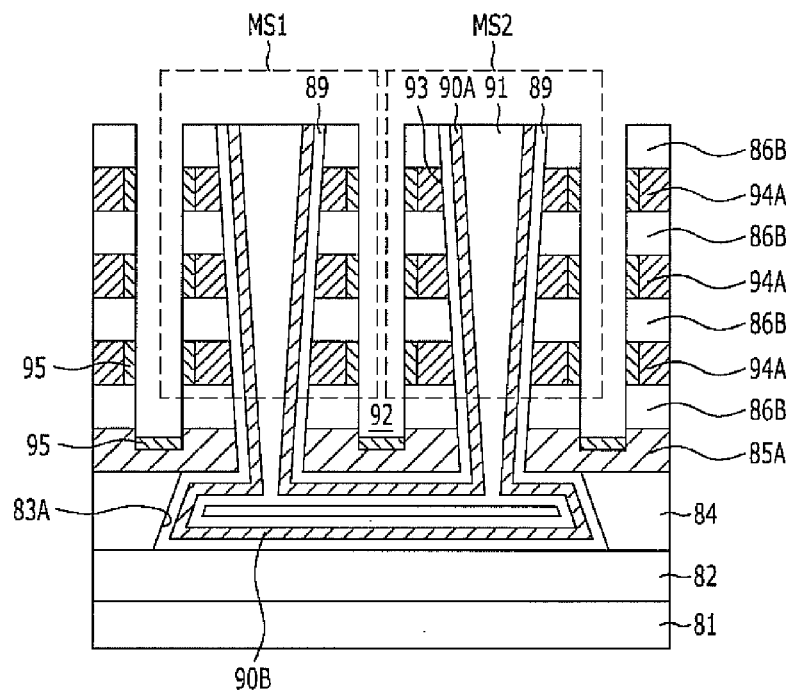
FIG. 11J illustrates a modification of the fifth exemplary embodiment.

FIG. 11J illustrates a modification of the fifth exemplary embodiment. When the third conductive layer 94 includes a polysilicon layer, a metal layer deposition and a silicide (95) process may be performed after the formation of the control gate electrodes 94A. Accordingly, the silicide 95 may also be formed at the sidewalls of the control gate electrodes 94A. The metal layer is removed after the silicide (95) process.

Figure 12:
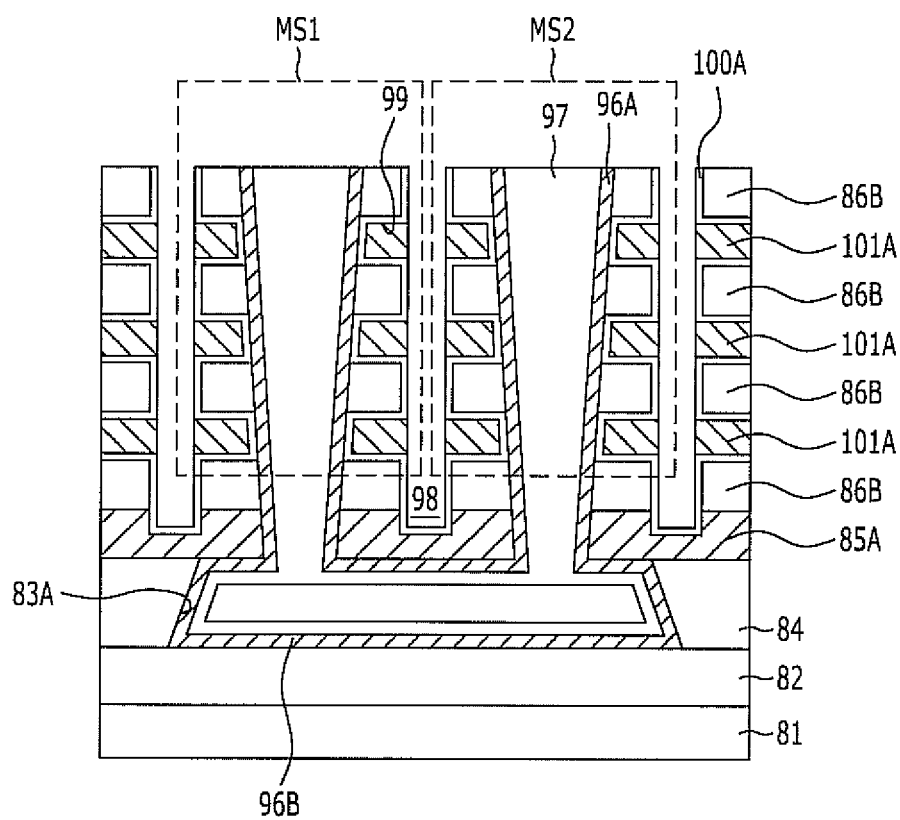
FIG. 12 is a cross-sectional view illustrating a structure of a nonvolatile memory device in accordance with a sixth exemplary embodiment of the present invention.

FIG. 12 is a cross-sectional view illustrating a structure of a nonvolatile memory device in accordance with a sixth exemplary embodiment of the present invention.

Referring to FIG. 12, the nonvolatile memory device includes a pair of cell channels 96A protruding from a substrate 81, a pipe channel 96B coupling the bottoms of the pair of the cell channels 96A, a pipe gate 85A surrounding the bottoms of the cell channels 96A, first and second insulation layers 82 and 84 in which the pipe channel 96B is buried, and control gate electrodes 101A surrounding the cell channels 96A. The control gate electrodes 101A between the cell channels 96A are separated from one another by a slit 98. Due to the pipe gate 85A, the bottoms of the cell channels 96A become a pipe channel 96B.

Specifically, the substrate 81 may include a silicon substrate. The first insulation layer 82 and the second insulation later 84 may include an oxide layer, such as a silicon oxide layer. The first insulation layer 82 and the second insulation layer 84 have a pipe channel hole 83A. Hereinafter, with regards to the sixth exemplary embodiment, the first insulation layer 82 and the second insulation layer 84 together will be referred to as a pipe insulation layer.

The pipe gate 85A formed on the second insulation layer 84 may include a silicon layer, in particular, an N$^+$ polysilicon layer.

The cell channels 96A and the pipe channel 96B are formed of the same material. For example, the cell channels 96A and the pipe channel 96B may include a polysilicon layer, specifically, an undoped polysilicon layer. The cell channels 96A and the pipe channel 96B collectively form a U-shaped structure.

The cell channels 96A are surrounded by the control gate electrodes 101A and the third insulation patterns 86B, which are alternately stacked. Sidewalls of the cell channel 96A are surrounded by a charge storage or charge trapping layer 100A, and the inside of the cell channels 96A is filled with the fourth insulation pattern 97. The charge storage or charge trapping layer 100A may include a blocking layer, a charge trap layer, and a tunnel insulation layer. The fourth insulation pattern 97 may include an oxide layer, such as a silicon oxide layer.

The pipe gate 85A is formed under the lowermost control gate electrode 101A, and the pipe gate 85A serves as an etch stop layer during the formation of the slit 98.

Two memory strings MS1 and MS2 are formed by the slit 98. A pipe channel transistor PCTr is formed by the pipe gate 85A and the pipe channel 96B. The two memory strings MS1 and MS2 are coupled to the pipe channel transistor PCTr. Consequently, the two memory strings MS1 and MS2 are coupled in series through the pipe channel transistor PCTr to thereby constitute a single memory cell string. For example, where three memory cells are formed in each memory string, the single memory cell string includes six memory cells.

In the sixth exemplary embodiment, the pipe gate 85A having a fiat shape is formed under the lowermost control gate electrode 101A, and the single pipe channel transistor having the pipe gate 85A is provided. Since the pipe gate 85A serves as an etch stop layer during the formation of the slit 98, damage to the pipe channel 96B buried in the pipe channel hole 83A may be prevented.

FIGS. 13A to 13F are cross-sectional views illustrating a method for fabricating a nonvolatile memory device in accordance with a sixth exemplary embodiment of the present invention. In the sixth exemplary embodiment, the processes until the process of opening the pipe channel hole 83A are performed in the same manner as those of the fifth exemplary embodiment as illustrated in FIGS. 11A to 11D.

Figure 13A:
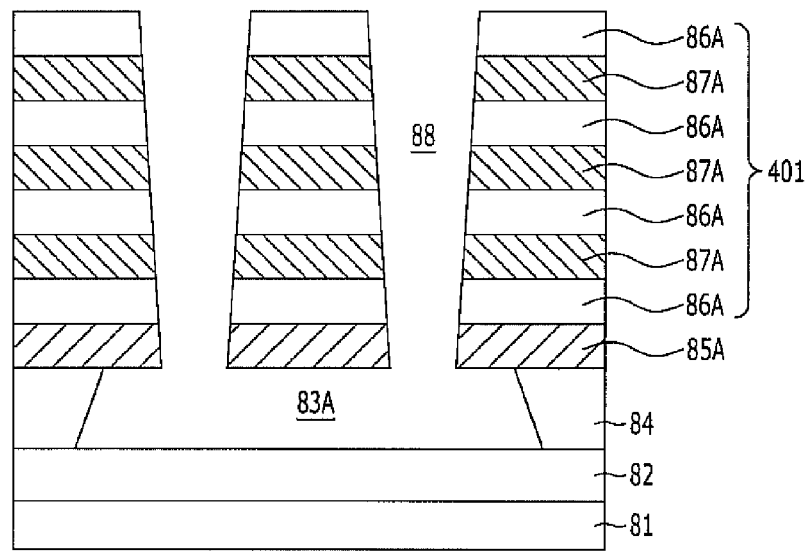
FIGS. 13A to 13F are cross-sectional views illustrating a method for fabricating a nonvolatile memory device in accordance with the sixth exemplary embodiment of the present invention.

Referring to FIG. 13A, the pipe channel hole 83A coupling the pair of the pipe channel holes 88 is opened.

Figure 13B:
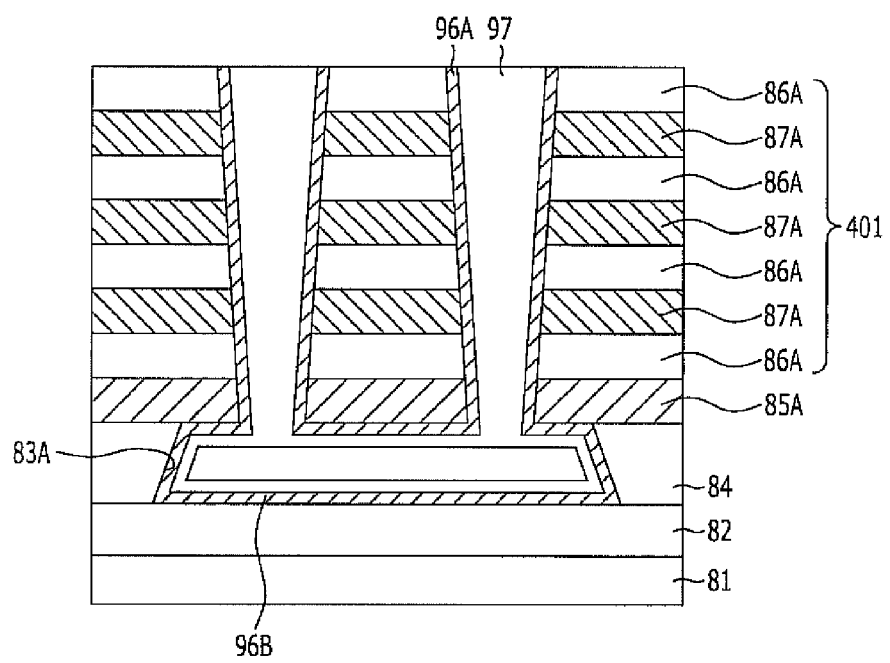

Referring to FIG. 13B, a second conductive layer and a fourth insulation layer 97 are formed to fill the cell channel holes 88 and planarized using a CMP process or the like. The second conductive layer may include a polysilicon layer, specifically, an undoped polysilicon layer.

Due to such a planarization process, columnar cell channels 96A are formed within the cell channel holes 88, and a pipe channel 96B is formed within the pipe channel hole 83A. The cell channels 96A and the pipe channel 96B are formed by the second conductive layer. The pipe channel 96B couples the pair of the adjacent cell channels 96A. Accordingly, the cell channel 96A and the pipe channel 96B collectively form a U-shaped structure. Due to the fourth insulation layer 97, a hollow region may be formed inside the pipe channel hole 83A.

Figure 13C:
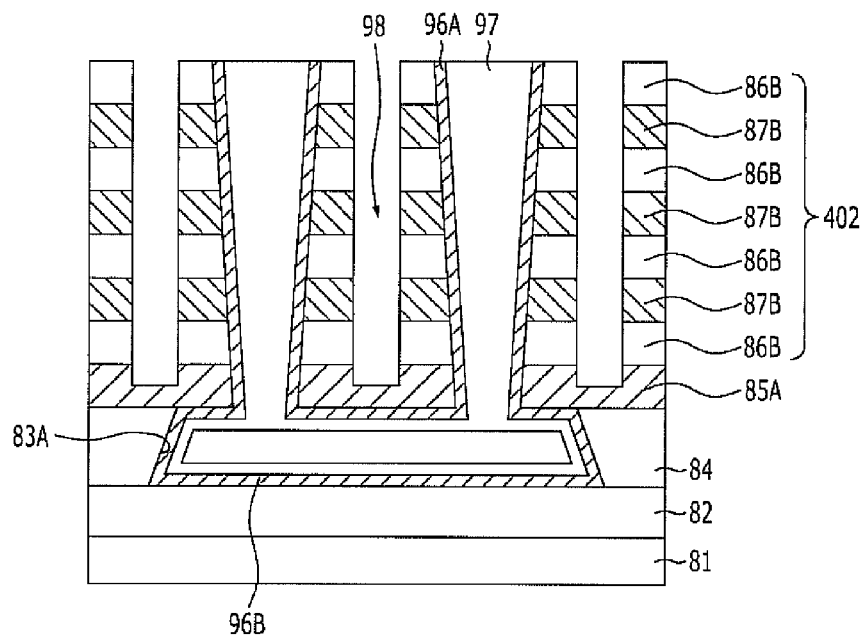

Referring to FIG. 13C, a slit etching process is performed to form a slit 98. The slit 98 is formed in the insulation layer stack 401 to form the insulation layer stack 402 having third insulation patterns 86B and second sacrificial patterns 87B, which are alternately stacked. Further, the bottom of the slit 98 extends to the pipe gate 85A.

During the slit etching process for forming the slit 98, the etching may be stopped at the pipe gate 85A. Consequently, damage to the pipe channel 96B may be prevented.

Figure 13D:
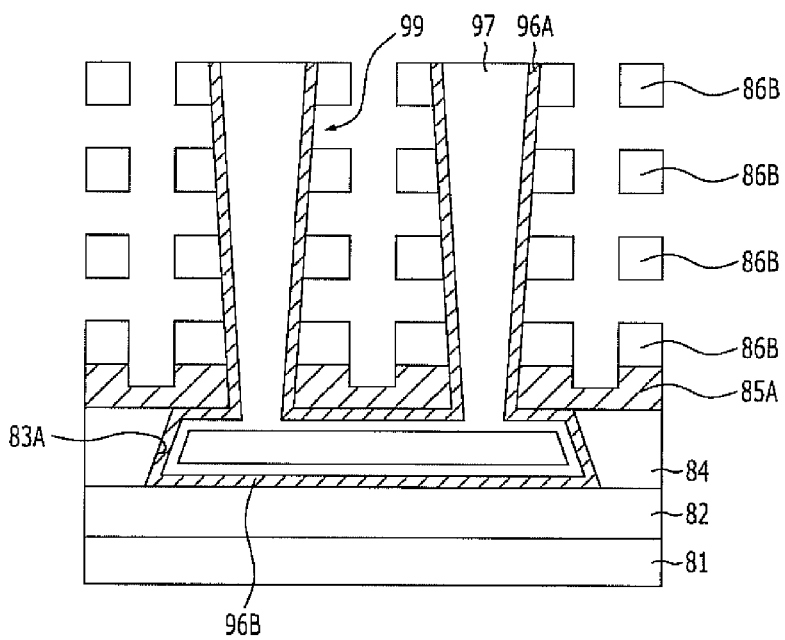

Referring to FIG. 13D, the second sacrificial patterns 87B are selectively removed. Accordingly, undercuts 99 are formed between the third insulation patterns 86B where the second sacrificial patterns 87B are removed.

Figure 13E:
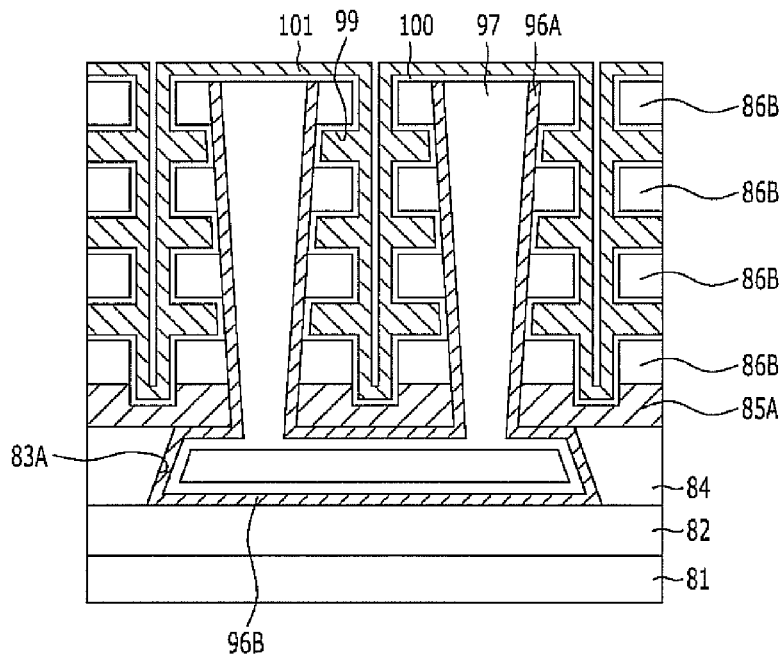

Referring to FIG. 13E, a charge storage or charge trapping layer 100 is formed on a resulting structure including the undercuts 99. The charge storage or charge trapping layer 100 may include a blocking layer, a charge trap layer, and a tunnel insulation layer. That is, the charge storage or charge trapping layer 100 is formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer may include an oxide layer, such as a silicon oxide layer. The charge trap layer is used as an actual data storage and includes a charge trap layer which traps charges in a deep level trap site. The charge trap layer may include a nitride layer. Therefore, the charge storage or charge trapping layer 100 may have an oxide-nitride-oxide (ONO) structure.

A third conductive layer 101 is formed on the charge storage or charge trapping layer 100 to fill the undercuts 101. The third conductive layer 101 may include a silicon layer or a metal layer. The third conductive layer 101 is used as the control gate electrodes of the memory cell.

Figure 13F:
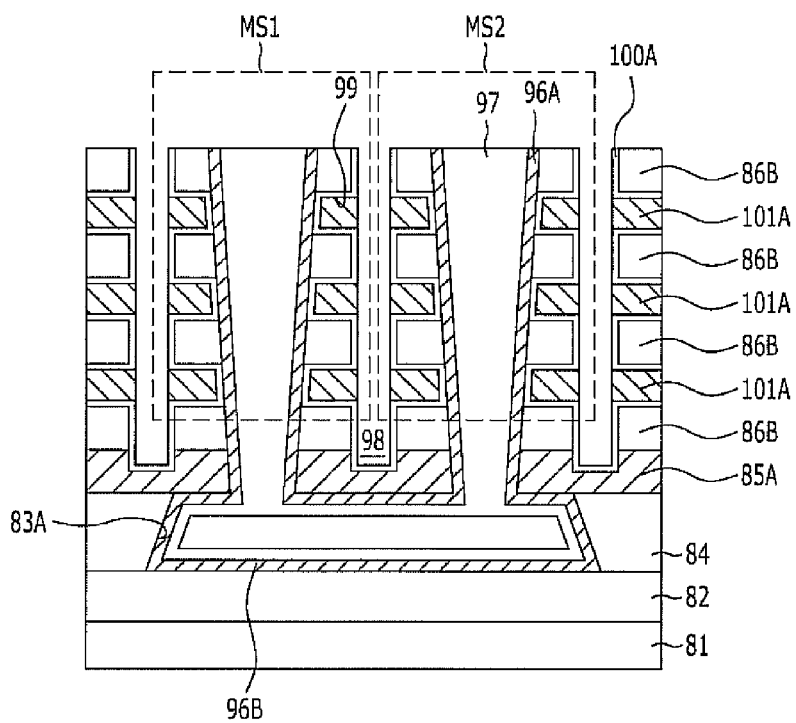

Referring to FIG. 13F, control gate electrodes 101A are formed by selectively separating the third conductive layer 101. The control gate electrodes 101A surround the cell channel 96A while filling the undercuts 99. As a result, the cell channels 96A pass through the control gate electrodes 101A, and a charge storage or charge trapping layer 100A is formed between the cell channels 96A and the control gate electrodes 101A. In order to form the control gate electrodes 101A, a CMP process and an etch-back process are sequentially performed. The use of the etch-back process makes it easy to selectively separate the third conductive layer 101 to form the control gate electrodes 101A.

As such, due to the formation of the control gate electrodes 101A, two memory strings MS1 and MS2, in which third insulation patterns 86B and control gate electrodes 101A are alternately stacked, are formed.

A pipe gate 85B is formed under the memory strings MS1 and MS2, and a second insulation layer 84 is formed under the pipe gate 85A. The bottoms of the adjacent cell channels 96A are coupled together through the pipe channel 96B. The pipe channel 96B is buried within the pipe channel hole 83A. The bottoms of the cell channels 96A, which are surrounded by the pipe gate 85A, are considered to be part of the pipe channel 96B. The pipe gate 85A and the pipe channel 96B form a pipe channel transistor.

Figure 14:
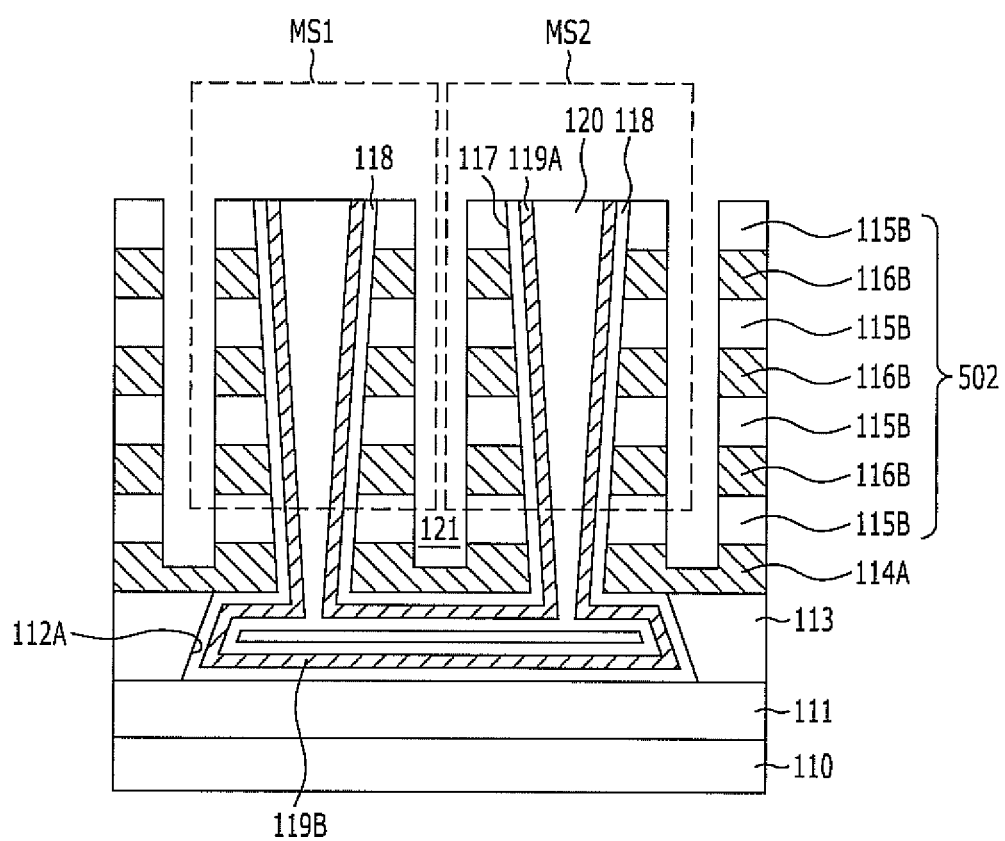
FIG. 14 is a cross-sectional view illustrating a structure of a nonvolatile memory device in accordance with a seventh exemplary embodiment of the present invention.

FIG. 14 is a cross-sectional view illustrating a structure of a nonvolatile memory device in accordance with a seventh exemplary embodiment of the present invention.

Referring to FIG. 14, the nonvolatile memory device includes a pair of cell channels 119A protruding from a substrate 110, a pipe channel 119B coupling the bottoms of the pair of the cell channels 119A, a pipe gate 114A surrounding the bottoms of the cell channels 119A, first and second insulation layers 111 and 113 in which the pipe channel 119B is buried, and control gate electrodes 116B surrounding the cell channels 119A. The control gate electrodes 116B between the cell channels 119A are separated from one another by a slit 121.

Specifically, the substrate 110 may include a silicon substrate. The first insulation layer 111 and the second insulation later 113 may include an oxide layer, such as a silicon oxide layer. The first insulation layer 111 and the second insulation layer 113 have a pipe channel hole 112A. Hereinafter, in the seventh exemplary embodiment, the first insulation layer 111 and the second insulation layer 113 together will be referred to as a pipe insulation layer.

The pipe gate 114A formed on the second insulation layer 113 includes a silicon layer, in particular, an N$^+$ polysilicon layer.

The cell channels 119A and the pipe channel 119B are formed of the same material. For example, the cell channels 119A and the pipe channel 119B include a polysilicon layer, specifically, an undoped polysilicon layer. The cell channels 119A and the pipe channel 119B collectively form a U-shaped structure.

The cell channels 119A are surrounded by the control gate electrodes 116B and the third insulation patterns 115B, which are alternately stacked. Sidewalls of the cell channel 119A are surrounded by a charge storage or charge trapping layer 118, and the inside of the cell channels 119A is filled with a fourth insulation pattern 120. The charge storage or charge trapping layer 118 may include a blocking layer, a charge trap layer, and a tunnel insulation layer. The fourth insulation pattern 120 may include an oxide layer, such as a silicon oxide layer.

The pipe gate 114A is formed under the lowermost control gate electrode 116B, and the pipe gate 114A serves as an etch stop layer during the formation of the slit 121.

Two memory strings MS1 and MS2 are formed by the slit 121. A pipe channel transistor PCTr is formed by the pipe gate 114A and the pipe channel 119B. The two memory strings MS1 and MS2 are coupled to the pipe channel transistor PCTr. Consequently, the two memory strings MS1 and MS2 are coupled in series through the pipe channel transistor PCTr to thereby constitute a single memory cell string. For example, where three memory cells are formed in each memory string, the single memory cell string includes six memory cells.

In the seventh exemplary embodiment, the pipe gate 114A is formed under the lowermost control gate electrode 116B, and the single pipe channel transistor having the pipe gate 114A is provided. Since the pipe gate 114A serves as an etch stop layer during the formation of the slit 121, damage to the pipe channel 119B buried in the pipe channel hole 112A may be prevented.

FIGS. 15A to 15F are cross-sectional views illustrating a method for fabricating a nonvolatile memory device in accordance with the seventh exemplary embodiment of the present invention.

Figure 15A:
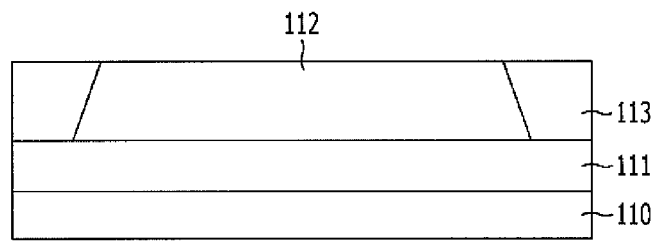
FIGS. 15A to 15F are cross-sectional views illustrating a method for fabricating a nonvolatile memory device in accordance with a seventh exemplary embodiment of the present invention.

Referring to FIG. 15A, a first insulation layer 111 is formed on a substrate 110. The substrate 110 may include a silicon substrate. The first insulation layer 111 may include an oxide layer.

A sacrificial layer 112 is formed on the first insulation layer 111. The sacrificial layer 112 may be formed by a photolithography process and an etching process. The sacrificial layer 112 may include a nitride layer, such as a silicon nitride layer.

A second insulation layer 113 is formed on the sacrificial layer 112 and planarized until the surface of the sacrificial layer 112 is exposed. The planarization process may include a CMP process. The second insulation layer 113 may include an oxide layer.

Figure 15B:
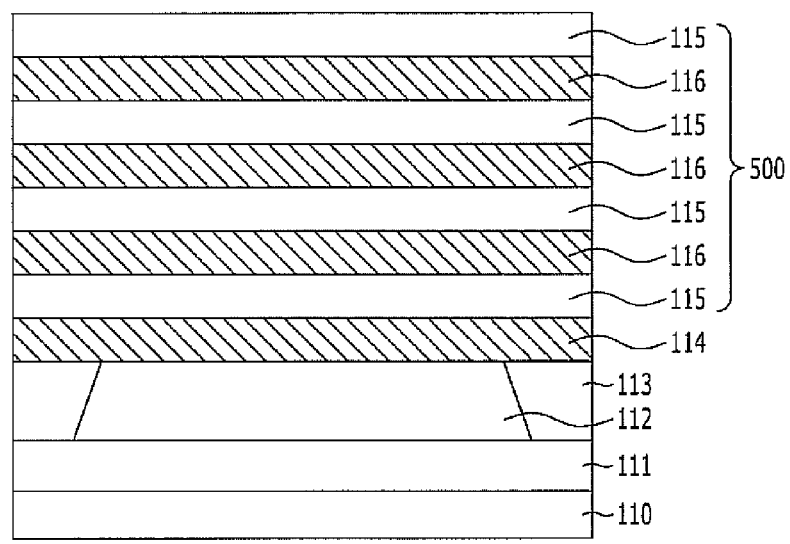

Referring to FIG. 15B, a first conductive layer 114 is formed on a resulting structure including the sacrificial layer 112 and the second insulation layer 113. The first conductive layer 114 may include a silicon layer, in particular, an N⁺ polysilicon layer. The first conductive layer 114 is used as a pipe gate.

A cell stack 500, in which third insulation layers 115 and second conductive layers 116 are alternately stacked, is formed on the first conductive layer 114. The third insulation layers 115 separate the control gate electrodes of the plurality of memory cells stacked in a vertical direction. The third insulation layers 115 may include an oxide layer. The uppermost layer of the cell stack 500 is one of the third insulation layers 115. Also, the second conductive layers 116 are used as control gate electrodes of a memory cell. The second conductive layers 116 include a polysilicon layer doped with a P-type impurity or N-type impurity. In this exemplary embodiment, the second conductive layers 116 are formed of P⁺ polysilicon. The third insulation layers 115 and the second conductive layers 116 are repetitively formed according to the number of the memory cells desired to be stacked. Although any number of memory cells may be stacked, for convenience of explanation, the memory strings each include three stacked memory cells, and therefore, the memory cell string includes six memory cells. A third conductive layer for a selection transistor may be further stacked, and its illustration is omitted.

Figure 15C:
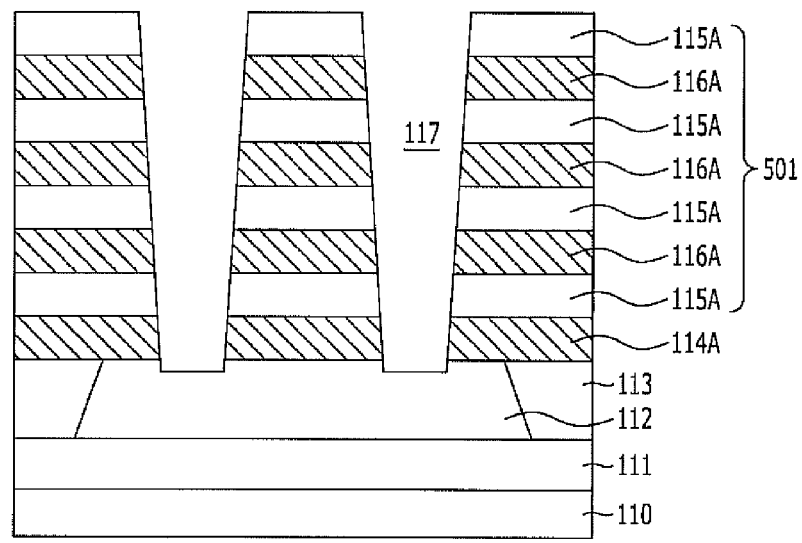

Referring to FIG. 15C, the cell stack 500 and the first conductive layer 114 are etched to form cell channel holes 117 exposing two separate portions of the surface of the sacrificial pattern 112. The cell channel holes 117 are formed to pass through the cell stack 500 and the first conductive layer 114. As a result of forming the cell channel holes 117, the cell stack 501 has a structure in which third insulation patterns 115A and second conductive patterns 116A are alternately stacked. Also, the first conductive layer becomes the pipe gate 114A. The cell channel holes 117 pass through the third insulation patterns 115A, the second conductive patterns 116A, and the pipe gate 114A. Before forming the cell channel holes 117, the ends of the second conductive patterns 115A may be etched using, for example, a sliming etching process, to form a stepped shape structure.

Figure 15D:
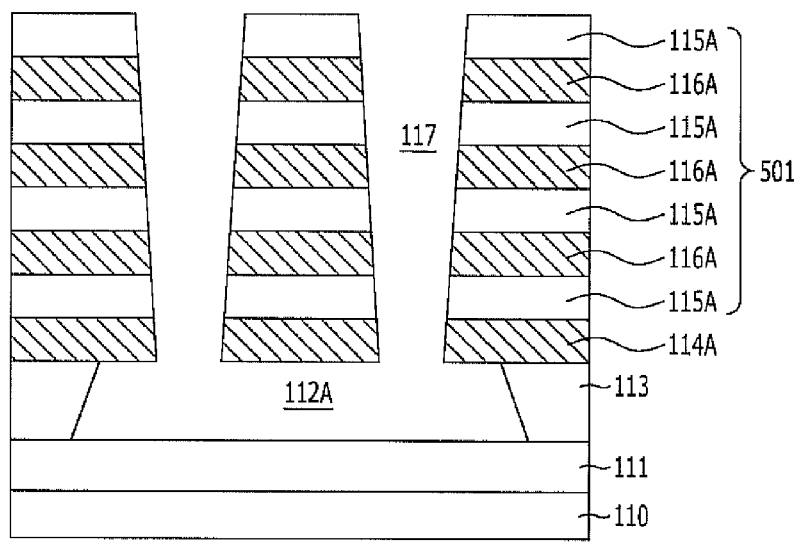

Referring to FIG. 15D, the sacrificial layer 112 is removed. Accordingly, the pipe channel hole 112A is opened. The sacrificial layer 112 may be removed by a wet process, in particular, a wet strip process. Accordingly, only the sacrificial layer 112 may be selectively removed without causing damage to the pipe gate 114A, the second conductive patterns 116A, and the third insulation patterns 115A.

An opening exists between the pipe channel hole 112A and the adjacent cell channel holes 117. Accordingly, the cell channel holes 117 and the pipe channel hole 112A collectively form a U-shaped opening.

Figure 15E:
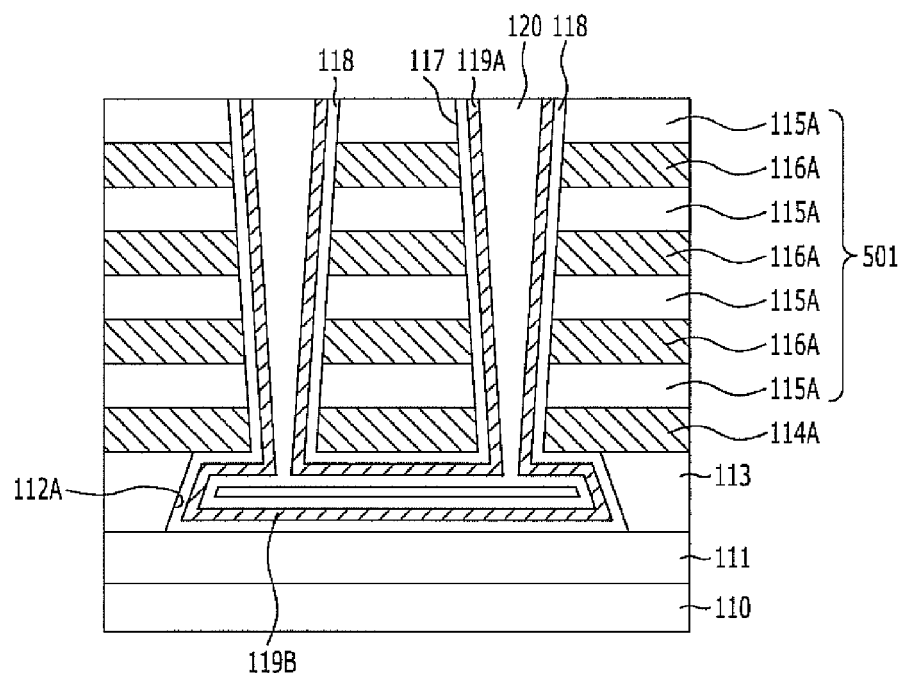

Referring to FIG. 15E, a charge storage or charge trapping layer 118, a third conductive layer, and a fourth insulation layer 120 are sequentially formed on a resulting structure including the pipe channel hole 112A. A planarization process is performed to expose the uppermost third insulation pattern 115A of the cell stack 501. The planarization process may include a CMP process.

Due to such a planarization process, columnar cell channels 119A are formed within the cell channel hole 117, and a pipe channel 119B is formed within the pipe channel hole 112A. The cell channel 119A and the pipe channel 119B are formed by planarizing the third conductive layer. The pipe channel 119B couples the adjacent cell channels 119A. Accordingly, the cell channels 119A and the pipe channel 119B collectively form a U-shaped structure. Due to the fourth insulation pattern 120, a hollow region is formed inside of the pipe channel hole 112A. Hereinafter, in the seventh exemplary embodiment, the bottom portions of the cell channels 119A surrounded by the pipe gate 114A are considered to be part of the pipe channel 119B.

The charge storage or charge trapping layer 118 may include a blocking layer, a charge trap layer, and a tunnel insulation layer. That is, the charge storage or charge trapping layer 118 is formed by sequentially stacking the blocking layer, the charge trap layer, and the tunnel insulation layer. The blocking layer prevents charges from passing through the charge trap layer and moving toward the gate electrode. The blocking layer may include an oxide layer formed by a thermal oxidation process or a deposition process. The tunnel insulation layer includes an oxide layer such as a silicon oxide layer. The charge trap layer is used as an actual data storage and includes a charge trap layer which traps charges in a deep level trap site. The charge trap layer may include a nitride layer. Therefore, the charge storage or charge trapping layer 118 may have an oxide-nitride-oxide (ONO) structure.

The third conductive layer which becomes the cell channels 119A and the pipe channel 119B may include a silicon layer. In particular, the third conductive layer may include a polysilicon layer, specifically, an undoped polysilicon layer.

The fourth insulation layer 120 may include an oxide layer. When forming the fourth insulation layer 120, the bottom of the cell channel holes 117 is sealed. Accordingly, a hollow region is formed within the pipe channel hole 112A.

Figure 15F:
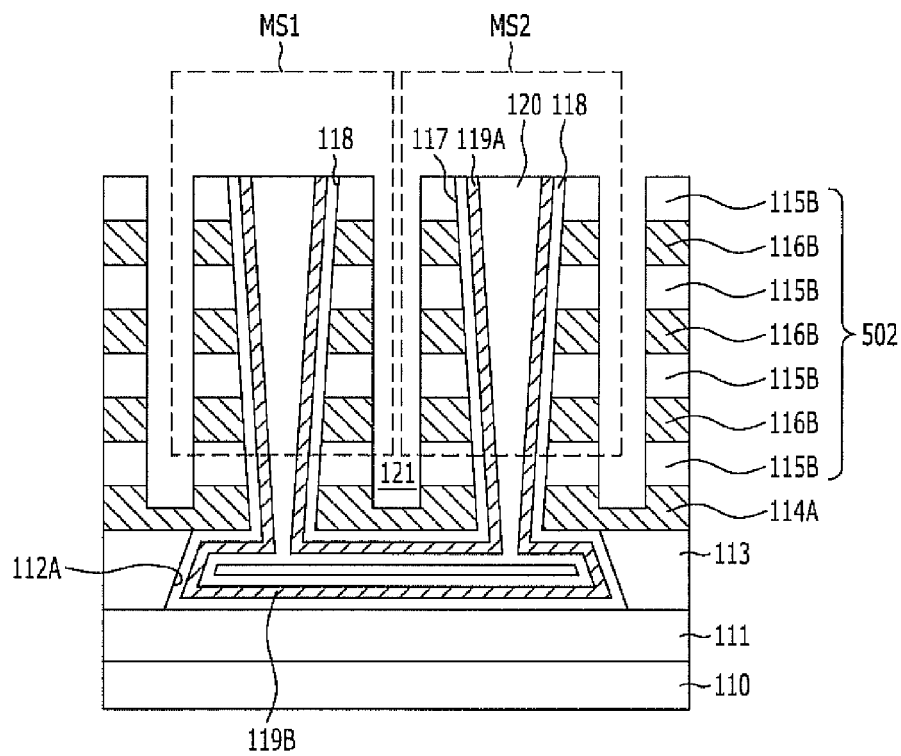

Referring to FIG. 15F, a slit etching process is performed to separate the control gate electrodes 116B between the adjacent memory strings MS1 and MS2. As a result, a slit 121 is formed. In is order to form the slit 121, the third insulation patterns 115A and the second conductive patterns 116A are etched, and the etching is stopped at the pipe gate 114A. A portion of the pipe gate 114A may be etched as well. However, the slit 121 does not pass through the pipe channel 119B.

As such, due to the formation of the slit 121, two memory strings MS1 and MS2, in which third insulation patterns 115B and control gate electrodes 116B are alternately stacked, are formed. The memory strings MS1 and MS2 include the charge storage or charge trapping layers 118 and the cell channels 119A buried in the cell channel holes 117. A fourth insulation layer 120 is formed within the cell channels 119A. The fourth insulation layer 120 also forms a hollow region in the pipe channel hole 112A.

A pipe gate 114A is formed between the memory strings MS1 and MS2. The bottoms of the cell channels 119A are coupled together through the pipe channel 119B. The pipe channel 119B is buried in the pipe channel hole 112A. The pipe gate 114A and the pipe channel 119B form a pipe channel transistor.

Due to the pipe gate 114A, damage to the pipe channel 119B is prevented during the slit etching process.

A silicide (not shown) may be formed on sidewalls of the control gate electrodes 116B exposed within the slit 121.

In the above-described exemplary embodiments of the present invention, since the etching may be stopped by the passivation layer and the second pipe gate during the slit etching process, it is possible to prevent damage to the first pipe gate and the pipe channel coupling the columnar cell channels, thereby improving the etching margin.

Furthermore, since the pipe gate is additionally formed under the memory strings, an increase in the channel distance is prevented, and thus, the lowering of the cell on current may be prevented.

Moreover, since the single pipe gate surrounding the bottoms of the cell channels is formed, the etching may be stopped at the pipe gate during the slit etching process, thereby improving the etching margin and preventing the lowering of the cell on current.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a pipe insulation layer surrounding a pipe channel hole;
   a pipe gate disposed over the pipe insulation layer;
   a pair of cell strings each having a columnar cell channel; and
   a pipe channel coupling the columnar cell channels and surrounding inner sidewalls and a bottom of the pipe channel hole,
   wherein the pipe channel includes a first pipe channel surrounding inner side walls and the bottom of the pipe channel hole and a pair of second pipe channels, each coupled the corresponding columnar cell channel,
   wherein the pipe gate surrounds the second pipe channels.

2. The nonvolatile memory device of claim 1 wherein the cell strings are separated by a slit having a depth extending to the surface of the pipe gate.

3. The nonvolatile memory device of claim 1, wherein each of the cell strings comprises:
   a charge storage or charge trapping layer surrounding the columnar cell channel; and
   an interlayer insulation layer and a gate electrode surrounding the charge storage or charge trapping layer.

4. The nonvolatile memory device of claim 1, wherein each of the cell strings comprises:
   an interlayer insulation layer having a plurality of undercuts, which partially expose the sidewalls of the columnar cell channel, and surrounding the columnar cell channel;
   a charge storage or charge trapping layer covering the undercuts; and
   a plurality of gate electrodes disposed on the charge storage or charge trapping layer filling the undercuts.

5. The nonvolatile memory device of claim 1, wherein the pipe insulation layer comprises an oxide layer.

6. The nonvolatile memory device of claim 1, wherein the pipe gate includes a first conductive layer and each of the cell strings includes a plurality of gate electrodes formed of a second conductive layer different from the first conductive layer.

7. The nonvolatile memory device of claim 6, the first conductive layer comprises an N+ polysilicon layer, and the second conductive layer comprises a P+ polysilicon layer.

8. The nonvolatile memory device of claim 6, the first conductive layer comprises a polysilicon layer, and the second conductive layer comprises a metal layer.

9. A nonvolatile memory device comprising:
   a first pipe gate surrounding a pipe channel hole;
   a second pipe gate disposed over the first pipe gate;
   a pair of cell strings each having a columnar cell channel; and
   a pipe channel coupling the columnar cell channels and surrounding inner sidewalls and a bottom of the pipe channel hole,
   wherein the pipe channel includes a first pipe channel formed within the pipe channel hole and a pair of second pipe channels, each coupled to the corresponding columnar cell channel,
   wherein the second pipe gate surrounds the second pipe channels,
   wherein the first pipe gate and the second pipe gate are commonly coupled to a metal interconnection.

10. The nonvolatile memory device of claim 9, further comprising:
    a passivation layer disposed between the first pipe gate and the second pipe gate.

11. The nonvolatile memory device of claim 10, wherein the passivation layer comprises a nitride layer or an oxide layer.

12. The nonvolatile memory device of claim 10, wherein the cell strings are separated by a slit passing through the second pipe gate and having a depth extending to at least the surface of the passivation layer.

13. The nonvolatile memory device of claim 10, wherein the cell strings are separated by a slit having a depth extending to any one of an interlayer insulation layer formed between the second pipe gate and a gate electrode of each of the cell strings, the second pipe gate, and the passivation layer.

14. The nonvolatile memory device of claim 9, wherein each of the cell strings comprises:
    a charge storage or charge trapping layer surrounding the columnar cell channel; and
    an interlayer insulation layer and a gate electrode surrounding the charge storage or charge trapping layer.

15. The nonvolatile memory device of claim 9, wherein each of the cell strings comprises:
    an interlayer insulation layer having a plurality of undercuts, which partially expose the sidewalls of the columnar cell channel, and surrounding the columnar cell channel;
    a charge storage or charge trapping layer covering the undercuts; and a plurality of gate electrodes disposed on the charge storage or charge trapping layer filling the undercuts.

16. The nonvolatile memory device of claim 9, wherein the first pipe gate and the second pipe gate include a first conductive layer, and each of the cell strings includes a plurality of gate electrodes formed of a second conductive layer different from the first conductive layer.

17. The nonvolatile memory device of claim 16, wherein the first conductive layer comprises an N+ polysilicon layer, and the second conductive layer comprises a P+ polysilicon layer.

* * * * *